(12) United States Patent
Kim et al.

(10) Patent No.: US 9,269,457 B2
(45) Date of Patent: Feb. 23, 2016

(54) SEMICONDUCTOR DEVICE CAPABLE OF RESCUING DEFECTIVE CHARACTERISTICS OCCURRING AFTER PACKAGING

(71) Applicants: Jeong-kyoum Kim, Seoul (KR);
Seok-hun Hyun, Seongnam-si (KR);
Jung-hwan Choi, Hwaseong-si (KR);
Seong-jin Jang, Seongnam-si (KR)

(72) Inventors: Jeong-kyoum Kim, Seoul (KR);
Seok-hun Hyun, Seongnam-si (KR);
Jung-hwan Choi, Hwaseong-si (KR);
Seong-jin Jang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 166 days.

(21) Appl. No.: 13/777,428

(22) Filed: Feb. 26, 2013

(65) Prior Publication Data

US 2013/0223171 A1 Aug. 29, 2013

(30) Foreign Application Priority Data

Feb. 27, 2012 (KR) .......................... 10-2012-0019830

(51) Int. Cl.
*G11C 29/00* (2006.01)
*G11C 29/04* (2006.01)
*G11C 29/44* (2006.01)
*G11C 5/04* (2006.01)
*G11C 11/40* (2006.01)

(52) U.S. Cl.
CPC ................ *G11C 29/04* (2013.01); *G11C 29/44* (2013.01); *G11C 29/789* (2013.01); *G11C 5/04* (2013.01); *G11C 11/40* (2013.01); *G11C 2029/4402* (2013.01)

(58) Field of Classification Search
CPC ...... G11C 29/04; G11C 29/44; G11C 29/789; G11C 5/04

USPC .............................................. 365/200, 225.7
See application file for complete search history.

(56) References Cited

U.S. PATENT DOCUMENTS

| | | | |
|---|---|---|---|
| 6,434,033 B1 | 8/2002 | Chien | |
| 6,570,804 B1 * | 5/2003 | Blodgett | .................... 365/225.7 |
| 6,667,915 B2 * | 12/2003 | Yonezu et al. | ................ 365/200 |
| 7,274,615 B2 * | 9/2007 | Nakagawa et al. | ........ 365/225.7 |
| 7,304,900 B2 * | 12/2007 | Shibata et al. | ................ 365/200 |
| 7,333,383 B2 * | 2/2008 | Vogelsang | ................. 365/225.7 |
| 7,366,946 B2 | 4/2008 | Derner et al. | |
| 7,379,361 B2 | 5/2008 | Co et al. | |
| 7,650,528 B2 | 1/2010 | Rahman et al. | |
| 7,760,545 B2 * | 7/2010 | Nakai | ........................... 365/163 |
| 7,813,194 B2 | 10/2010 | Martin et al. | |
| 7,835,206 B2 * | 11/2010 | Nishioka | ....................... 365/200 |

(Continued)

FOREIGN PATENT DOCUMENTS

KR 1020010056786 A 7/2001

*Primary Examiner* — Viet Q Nguyen
(74) *Attorney, Agent, or Firm* — Myers Bigel Sibley & Sajovec, PA

(57) ABSTRACT

A memory device capable of rescuing defective characteristics that occur after packaging includes a memory cell array including a plurality of memory cells and an antifuse circuit unit including at least one antifuse. The antifuse circuit unit stores a defective cell address of the memory cell array in the at least one antifuse and reads the defective cell address to an external source. The antifuse circuit unit stores a defective characteristic code in the at least one antifuse, wherein the defective characteristic code is related to at least one of a timing parameter spec., a refresh spec., an input/output (I/O) trigger voltage spec., and a data training spec. of the memory device, and outputs the defective characteristic code to an external source.

19 Claims, 19 Drawing Sheets

(56) References Cited

U.S. PATENT DOCUMENTS

| | | | |
|---|---|---|---|
| 7,859,925 B1* | 12/2010 | Stansell | 365/201 |
| 7,952,950 B2* | 5/2011 | Miyatake et al. | 365/225.7 |
| 8,125,843 B2* | 2/2012 | Konda | 365/201 |
| 8,208,324 B2* | 6/2012 | Mochida et al. | 365/200 |
| 8,315,116 B2* | 11/2012 | Kim et al. | 365/200 |
| 8,339,868 B2* | 12/2012 | Miyatake | 365/189.05 |
| 8,422,327 B2* | 4/2013 | Teramoto et al. | 365/225.7 |
| 8,621,291 B2* | 12/2013 | Kinoshita | 714/711 |
| 8,699,256 B2* | 4/2014 | Kubouchi et al. | 365/96 |
| 2005/0112470 A1 | 5/2005 | Taylor et al. | |
| 2010/0157704 A1* | 6/2010 | Iwaki | 365/200 |
| 2010/0211853 A1 | 8/2010 | Madan et al. | |
| 2010/0302833 A1* | 12/2010 | Teramoto et al. | 365/96 |
| 2012/0014197 A1* | 1/2012 | Okuma | 365/201 |

\* cited by examiner

SEMICONDUCTOR DEVICE CAPABLE OF RESCUING DEFECTIVE CHARACTERISTICS OCCURRING AFTER PACKAGING

CROSS-REFERENCE TO RELATED APPLICATIONS

This application claims the benefit of Korean Patent Application No. 10-2012-0019830, filed on Feb. 27, 2012, in the Korean Intellectual Property Office, the disclosure of which is incorporated herein in its entirety by reference.

BACKGROUND

The inventive concept relates to a semiconductor device, and, more particularly, to a memory device capable of compensating for defective characteristics occurring after packaging, a memory module including the memory device, and a memory system including the memory module.

Many manufacturers fabricate memory modules. The manufacturers secure competitiveness by decreasing a price of a memory module, but they may face a low profit margin. Although a yield rate of production is relatively high, a defect may occur in memory chips mounted in the memory module. The memory chips are filtered as good products by a test. In this regard, a re-operation to remove the defective memory chip from the memory module and to re-mount another memory chip in the memory module is generally expensive and takes a long time, thereby increasing manufacturing costs. Thus, there, is a demand for a method of rescuing the defective memory chip without performing the re-operation on the memory module.

SUMMARY

According to an aspect of the inventive concept, there is provided a memory device including a memory cell array comprising a plurality of memory cells and an antifuse circuit unit comprising at least one antifuse that stores a defective cell address of the memory cell array in the at least one antifuse and outputs the defective cell address to an external source.

The antifuse circuit unit may store the defective cell address that occurs when the memory device is tested.

The antifuse circuit unit may store the defective cell address that occurs after the memory device is packaged.

The antifuse circuit unit may store and may update the defective cell address.

The antifuse circuit unit may read the defective cell address in response to a power-up detection signal indicating that a power of the memory device is stabilized.

The memory device may command a start of a read mode or a program mode of the antifuse circuit unit by using a refresh command for refreshing a plurality of pieces of data of the plurality of memory cells in the memory cell array.

The memory device may command an end of a read mode or a program mode of the antifuse circuit unit by using a refresh command for ending a refresh operation of the plurality of memory cells in the memory cell array.

The memory device may further include a selecting unit that receives data of each of the plurality of memory cells, which is read from the memory cell array, and the defective cell address that is read from the antifuse circuit unit, selects the data of each of the plurality of memory cells or the defective cell address, and then outputs the data or the defective cell address by using at least one data input/output (I/O) signal.

The memory device may include a through hole and a micro-bump connected to the through hole.

According to another aspect of the inventive concept, there is provided a memory device including a mode register decoder that receives an address signal and programming operation modes of the memory device and an antifuse circuit unit comprising at least one antifuse. The antifuse circuit unit programs a defective characteristic code according to the operation modes of the memory device to the at least one antifuse and outputs the defective characteristic code to an external source.

The antifuse circuit unit may store the defective characteristic code related to at least one of a timing parameter spec., a refresh spec., an input/output (I/O) trigger voltage spec., and a data training spec. of the memory device.

The memory device may further include an address decoder that decodes the address signal and programs the defective characteristic code to the at least one antifuse corresponding to the decoded address signal.

The antifuse circuit unit may program and may update the defective characteristic code.

The antifuse circuit unit may read the defective characteristic code in response to a power-up detection signal indicating that a power of the memory device is stabilized.

The memory device may further include a selecting unit that receives data of a memory cell, which is read from a memory cell array of the memory device, and the defective characteristic code that is read from the antifuse circuit unit, selects the data of the memory cell or the defective characteristic code in response to a selection signal generated in the mode register decoder, and then outputs the data or the defective characteristic code by using a data input/output (I/O) signal.

According to another aspect of the inventive concept, there is provided a memory module including at least one memory device and a memory buffer comprising a storage unit that is accessed instead of a defective cell, when an access to the defective cell in the at least one memory device is requested, wherein the at least one memory device comprises an antifuse circuit unit comprising at least one antifuse that stores an address of the defective cell of a memory cell array in the at least one antifuse and reads the address of the defective cell to the memory buffer.

The memory buffer may include a logic circuit unit that stores the address of the defective cell and generates a hit signal by comparing the address of the defective cell with an address that is input from an external source. The storage unit stores data intended to be written to the address of the defective cell and a selecting unit writes the data to the storage unit or reads data from the storage unit in response to the hit signal.

The storage unit may include only one register so as to rescue only the defective cell in the memory module.

The storage unit may include a plurality of registers so as to rescue a plurality of the defective cells in the memory module.

According to another aspect of the inventive concept, there is provided a memory system including at least one memory device and a memory controller comprising a storage unit that is accessed instead of a defective cell when an access to the defective cell in the at least one memory device is requested, wherein the at least one memory device comprises an antifuse circuit unit comprising at least one antifuse that stores an address of the defective cell of a memory cell array in the at least one antifuse and reads the address of the defective cell to the memory controller.

The memory controller may include a logic circuit unit that stores the address of the defective cell and generates a hit signal by comparing the address of the defective cell with an address that is input from an external source. The storage unit stores data intended to be written to the address of the defective cell and a selecting unit writes the data to the storage unit or reads data from the storage unit in response to the hit signal.

The logic circuit unit may include a fail address table that receives and stores the address of the defective cell read from the antifuse circuit unit of the memory module and an address comparing unit that generates the hit signal by comparing an address transmitted from a host with the address of the defective cell stored in the fail address table.

According to another aspect of the inventive concept, there is provided a memory system including at least one memory device and a memory controller that corrects a defective characteristic of the at least one memory device when an access to the at least one memory device is requested by a host, wherein the at least one memory device comprises an antifuse circuit unit comprising at least one antifuse that stores a defective characteristic code of the at least one memory device in the at least one antifuse and outputs the defective characteristic code to the memory controller.

The memory controller may include an antifuse mapping register that stores the defective characteristic code read from the at least one memory device, a first delay setting unit that receives a command requested by the host, controls an output time of the command, in response to the defective characteristic code stored in the antifuse mapping register, and transmits the command to the at least one memory device; a second delay setting unit that receives an address requested by the host, controls an output time of the address in response to the defective characteristic code stored in the antifuse mapping register, and transmits the address to the at least one memory device; and a third delay setting unit that exchanges data with the host, and controls a transmission time of the data exchanged with the host in response to the defective characteristic code stored in the antifuse mapping register.

The memory controller may include a latency control unit that controls a read latency, a write latency, or a CAS latency of data input to or output from the at least one memory device in response to the defective characteristic code stored in the antifuse mapping register.

The memory controller may control a reference voltage generating circuit that generates a trigger-level reference voltage of data input to or output from the at least one memory device in response to the defective characteristic code stored in the antifuse mapping register.

According to another aspect of the inventive concept, there is provided a memory module including at least one memory device and a memory buffer that corrects a defective characteristic of the at least one memory device when an access to the at least one memory device is requested by a host, wherein the at least one memory device comprises an antifuse circuit unit comprising at least one antifuse that stores a defective characteristic code of the at least one memory device in the at least one antifuse and outputs the defective characteristic code to the memory buffer.

The memory buffer may include an antifuse mapping register that stores the defective characteristic code read from the at least one memory device; a first delay setting unit that receives a command requested by the host, controls an output time of the command in response to the defective characteristic code stored in the antifuse mapping register, and transmits the command to the at least one memory device; a second delay setting unit that receives an address requested by the host, controls an output time of the address in response to the defective characteristic code stored in the antifuse mapping register, and transmits the address to the at least one memory device; and a third delay setting unit that exchanges data with the host and controls a transmission time of the data exchanged with the host in response to the defective characteristic code stored in the antifuse mapping register.

The memory buffer may include a latency control unit that controls a read latency, a write latency, or a CAS latency of data input to or output from the at least one memory device in response to the defective characteristic code stored in the antifuse mapping register.

The memory buffer may control a reference voltage generating circuit that generates a trigger-level reference voltage of data input to or output from the at least one memory device in response to the defective characteristic code stored in the antifuse mapping register.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
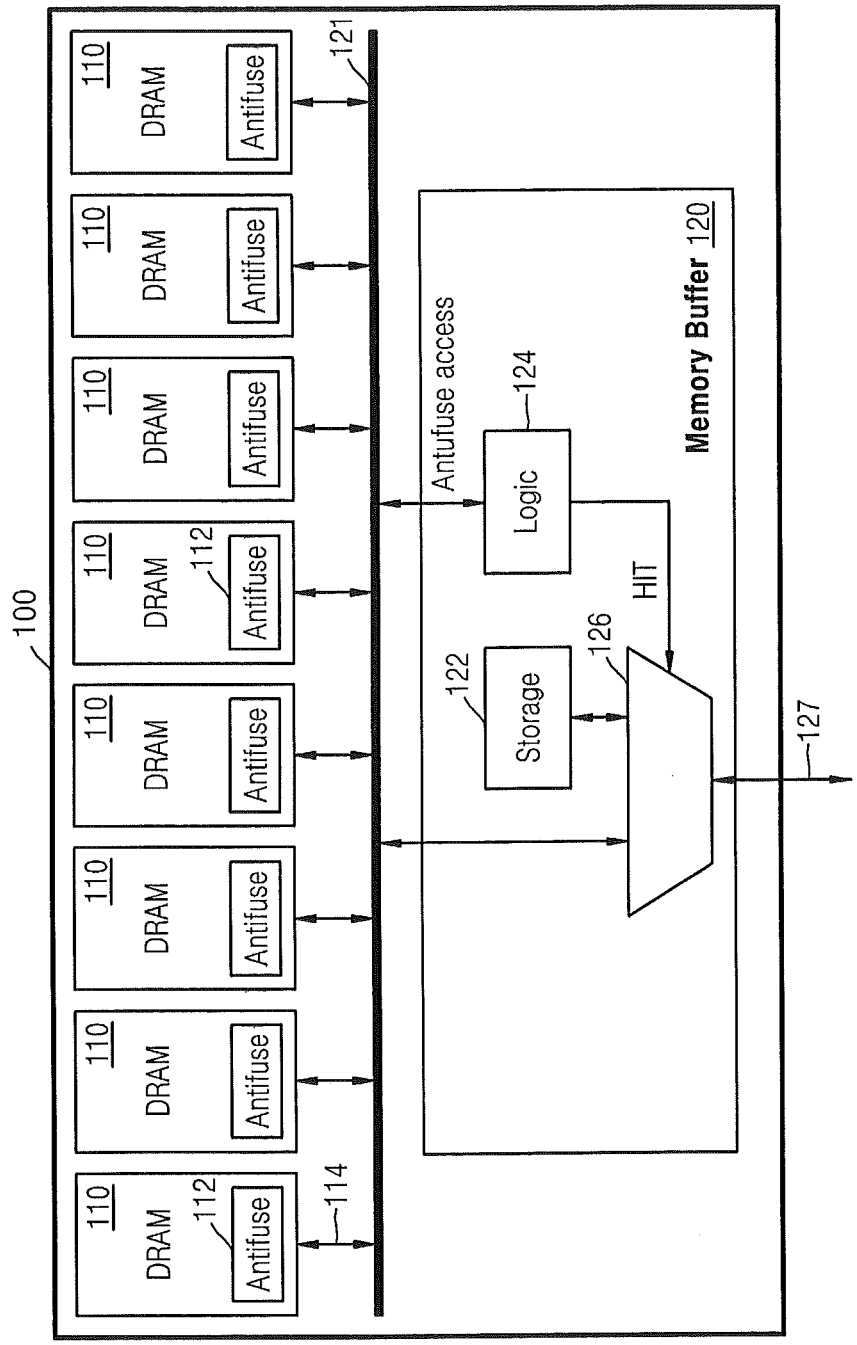
FIG. 1 is a diagram of a memory module including a plurality of memory devices, according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, similar reference numerals denote similar configuring elements, and the thicknesses of layers and regions are exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operations, a component, and/or groups thereof, not excluding the existence of one or more other recited forms, one or more other numbers, one or more other processes, one or more other operations, one or more other components and/or groups thereof.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

Expressions such as "at least one of," when preceding a list of elements, modify the entire list of elements and do not modify the individual elements of the list.

A storage capacity of a semiconductor memory device may increase due to developments in manufacturing technology. However, the number of defective memory cells may also increase due to the micronized manufacturing technology. The defective memory cells are typically replaced by redundant memory cells.

Defective addresses that address the defective memory cells are stored in a fuse circuit including a plurality of program fuses. When access to the defective memory cells is required, the fuse circuit controls an alternative access to be performed on the redundant memory cells, not the defective memory cells. The defective addresses are detected when a memory device is tested. The defective addresses are stored by programming the program fuses by using a laser beam irradiation method.

However, after the defective addresses are replaced, defective bits may occur due to thermal stress during packaging. When the defective bits occur after the packaging, the defective addresses cannot be replaced by using the laser beam irradiation method.

The number of defective bits occurring after the packaging is considerably less than the number of defective bits occurring when the memory device is tested. That is, there is a high possibility that a defect of the memory device, which occurs after the packaging is a single-bit error, not a multi-bit error.

Thus, it is generally recommended to replace the defective bits by units of a bit, not by units of a wordline or units of a bitline.

FIG. 1 is a diagram of a memory module 100 including a plurality of memory devices 110 according to an embodiment of the inventive concept.

Referring to FIG. 1, the memory module 100 includes the memory devices 110 and a memory buffer 120. For example, the memory module 100 may include eight memory devices 110, and each of the memory devices 110 may be formed as a dynamic random access memory (DRAM). Each memory device 110 may include an antifuse circuit unit 112 that stores a defective cell address. The antifuse circuit unit 112 may be formed as an antifuse array including a plurality of antifuses. Each memory device 110 receives and transmits read data and write data via a first data input/output (I/O) bus 114. For example, the first data I/O bus 114 may be formed of eight data I/O signal (DQ) lines. Alternatively, the first data I/O bus 114 may be formed of sixteen data I/O signal (DQ) lines, thirty-two data I/O signal (DQ) lines, or the like.

The memory buffer 120 may include a storage unit 122 that is accessed instead of a defective cell when there is a request for an access to the defective cell in the memory device 110. Data that is intended to be written to the defective cell in the memory device 110 may instead be written to the storage unit 122 in the memory buffer 120. When the defective cell in the memory device 110 is read, the read data is read from the storage unit 122 in the memory buffer 120, instead of from the defective cell.

The memory buffer 120 may include the storage unit 122, a logic circuit unit 124, and a selecting unit 126. The storage unit 122 may store data to be written to the defective cell address detected when the memory device 110 is tested. Also, the storage unit 122 may store data to be written to a defective cell address that newly occurs while the memory module 100 is mounted to and operates in a system. Accordingly, the storage unit 122 may update and store data to be written to a defective cell address that occurs during testing and when the memory module is placed into operation in a system. The storage unit 122 may be formed as a register or a memory device such as a static random access memory (SRAM).

The logic circuit unit 124 may store a defective cell address of the memory device 110. The defective cell address is read from the antifuse circuit unit 112 of the memory device 110. Also, the logic circuit unit 124 may include an address comparing unit (not shown) for comparing the defective cell address and an address that is input from an external source. The logic circuit unit 124 may be formed as an exclusive OR circuit for comparing an input address and a defective cell address, and may generate a hit signal HIT when the input address and the defective cell address match each other.

When the hit signal HIT is activated, the selecting unit 126 may write data to the storage unit 122, wherein the data is intended to be written to a defective memory cell in the memory device 110. Also, when the hit signal HIT is activated, the selecting unit 126 may read data from the storage unit 122, instead of from the defective memory cell.

When the hit signal HIT is deactivated, the selecting unit 126 may output read data of the memory device 110, which is received via a second data I/O bus 121, to an external source outside the memory module 100 via a third data I/O bus 127.

The second data I/O bus 121 is connected to the first data I/O bus 114 of each memory device 110. For example, in a case where the first data I/O bus 114 is formed of eight data I/O signal (DQ) lines, and eight memory devices 110 are mounted, the second data I/O bus 121 may be formed of sixty-four I/O signal (DQ) lines. In this case, the third data I/O bus 127 may also be formed of sixty-four I/O signal (DQ) lines.

Also, when the hit signal HIT is deactivated, the selecting unit 126 may transmit data, which is received via the third data I/O bus 127, to the second data I/O bus 121. The data transmitted to the second data I/O bus 121 may be written to the memory device 110 via the first data I/O bus 114.

The storage unit 122 may include only one register so as to rescue only one defective cell in the memory module 100. Alternatively, the storage unit 122 may include a plurality of registers so as to rescue a plurality of defective cells. This is because at least two memory devices 110 may be defective or two defects occur in one memory device 110.

Figure 2:
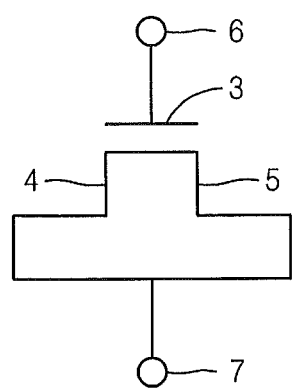
FIG. 2 is a diagram illustrating an antifuse included in an antifuse circuit unit of FIG. 1.

FIG. 2 is a diagram illustrating an antifuse 2 included in the antifuse circuit unit 112 of FIG. 1 according to an embodiment of the inventive concept. The antifuse circuit unit 112 may be formed as an antifuse array in which a plurality of the antifuses 2 are matrix-arrayed.

Referring to FIG. 2, the antifuse 2 is formed as a depletion-type Metal-oxide-semiconductor (MOS) transistor in which a source 4 and a drain 5 are connected. In an initial state, a resistance between a first node 6 connected to a gate terminal 3, and a second node 7 commonly connected to the source 4 and the drain 5 is very large because the first node 6 and the second node 7 are separated by a gate oxide layer. Accordingly, the first node 6 and the second node 7 are in a non-connection state. The antifuse 2 destroys the gate oxide layer by applying a breakdown voltage to an interface between the first node 6 and the second node 7, so that the first node 6 and the second node 7 may be irreversibly changed from the non-connection state to a connection state. When the gate oxide layer is destroyed, the resistance between the first node 6 and the second node 7 is decreased.

Figure 3:
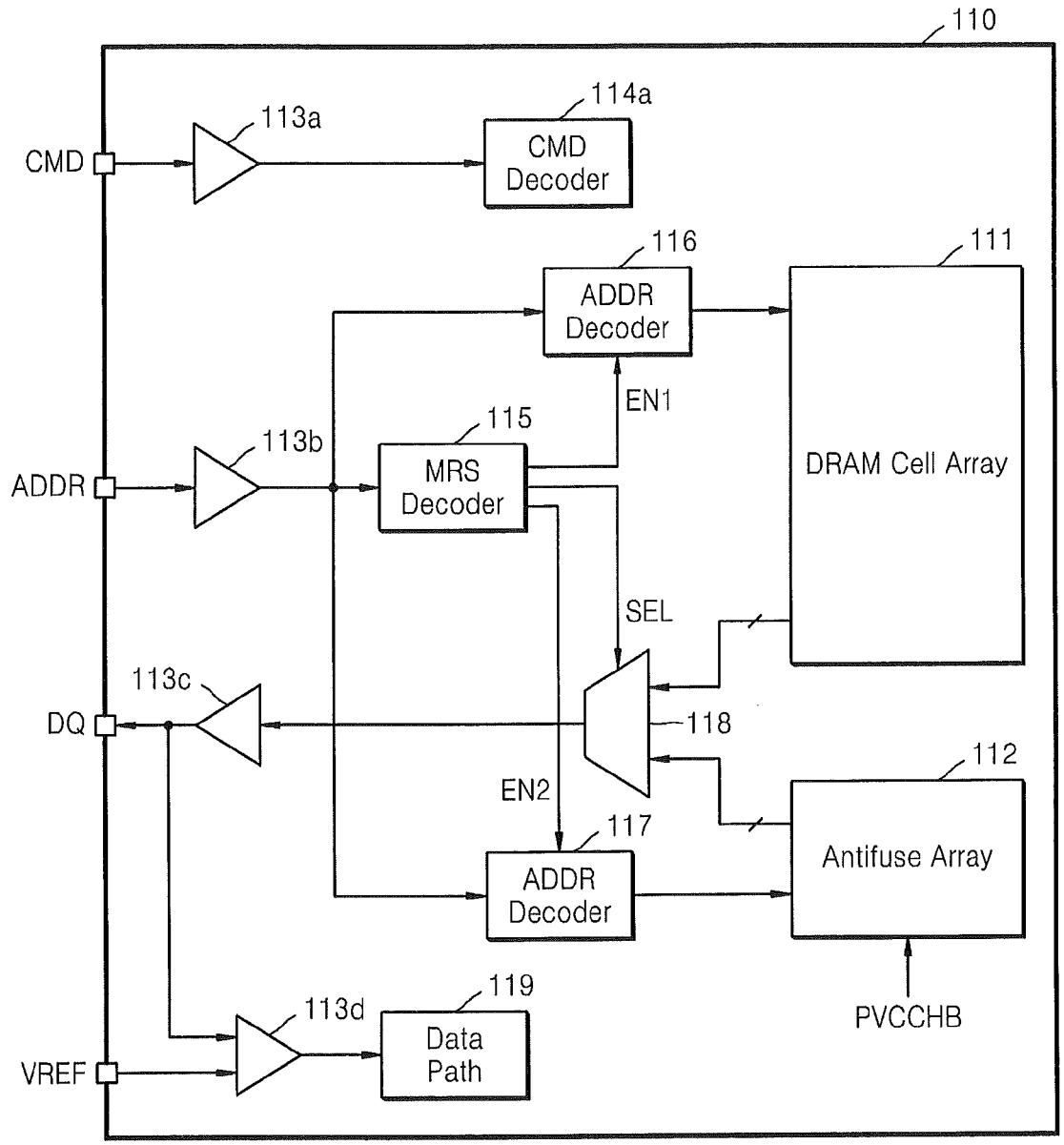
FIG. 3 is a block diagram specifically illustrating a memory device of FIG. 1.

FIG. 3 is a block diagram specifically illustrating the memory device 110 of FIG. 1 according to an embodiment of the inventive concept.

Referring to FIG. 3, the memory device 110 includes the antifuse circuit unit 112 formed as an antifuse array that stores a defective cell address. The memory device 110 may include a memory cell array 111 including a DRAM cell, and various circuit blocks for driving the DRAM cell. The memory device 110 may include a command input buffer 113a for receiving a command CMD from an external source, and an address input buffer 113b for receiving an address signal ADDR from an external source. The command CMD represents a combination of command signals including a clock signal CK, a clock enable signal CKE, a chip selection signal CSB, a low address strobe signal RASB, a column address strobe signal CASB, a write enable signal WEB, a data I/O mask signal DQM, and the like.

The received command CMD may be provided to a command decoder 114a, and the command decoder 114 may generate various types of internal command signals for controlling circuit blocks.

The received address signal ADDR may be provided to an MRS decoder 115, a first address decoder 116, and a second address decoder 117. The MRS decoder 115 may store the address signal ADDR and, thus, may program various operation modes of the memory device 110. For example, the MRS decoder 115 may program a CAS latency, an addressing mode, a burst length, a test mode, a DLL reset, and/or various user-specified options. The MRS decoder 115 may generate a first addressing enable signal EN1 and a second addressing enable signal EN2 to control the addressing mode, and a selection signal SEL. The first addressing enable signal EN1 is a signal for controlling a normal addressing mode, and the second addressing enable signal EN2 is a signal for controlling a repair addressing mode.

The first address decoder 116 may decode the address signal ADDR, in response to the first addressing enable signal EN1, may activate a wordline of the memory cell array 111, and may perform an selection operation with respect to a bitline of the memory cell array 111. The second address decoder 117 may decode the address signal ADDR, in response to the second addressing enable signal EN2, and may program an antifuse in the antifuse circuit unit 112. The programmed antifuse may store a defective cell address in the memory cell array 111.

The antifuse circuit unit 112 may store a defective cell address occurring when the memory device 110 is tested. Also, the antifuse circuit unit 112 may store a defective cell address detected when the memory module 100 of FIG. 1 is mounted to and operates in a system. The antifuse circuit unit 112 may update and store a defective cell address. The antifuse circuit unit 112 may output defective cell addresses stored in the antifuse array, in response to a power-up detection signal PVCCHB. The power-up detection signal PVCCHB indicates that a power voltage VDD is stabilized when the memory device 110 is powered up.

An addressing selecting unit 118 may select read data output from the memory cell array 111 or the defective cell address output from the antifuse circuit unit 112, in response to the selection signal SEL, and may output the read data or the defective cell address to a data output buffer 113c. For example, the addressing selecting unit 118 may output the defective cell address output from the antifuse circuit unit 112 to the data output buffer 113c, in response to activation of the selection signal SEL. Also, the addressing selecting unit 118 may output the read data output from the memory cell array 111 to the data output buffer 113c, in response to deactivation of the selection signal SEL.

The read data or the defective cell address, which is transmitted to the data output buffer 113c, is output to an external source via a data I/O signal DQ. Data to be written to a memory cell is transmitted to a data input buffer 113d via the data I/O signal DQ. The data input buffer 113d may be formed as a buffer that compares a reference voltage Vref and the written data and inputs the written data. The reference voltage Vref indicates an input trigger voltage of the record data. The record data may be recorded to the memory cell in the memory cell array 111 via a data path 119.

The defective cell address of the antifuse circuit unit 112, which is transmitted to the data output buffer 113c, is transmitted to the first data I/O bus 114 (refer to FIG. 1) via the data I/O signal DQ. The first data I/O bus 114 (refer to FIG. 1) is connected to the second data I/O bus 121 (refer to FIG. 1), and the second data I/O bus 121 (refer to FIG. 1) is connected to the logic circuit unit 124 (refer to FIG. 1) of the memory buffer 120 (refer to FIG. 1). The logic circuit unit 124 (refer to FIG. 1) may be connected to at least one of the data I/O signals DQ at the second data I/O bus 121 (refer to FIG. 1). The logic circuit unit 124 (refer to FIG. 1) may store the defective cell address read from the antifuse circuit unit 112 of the memory device 110.

Figure 4:
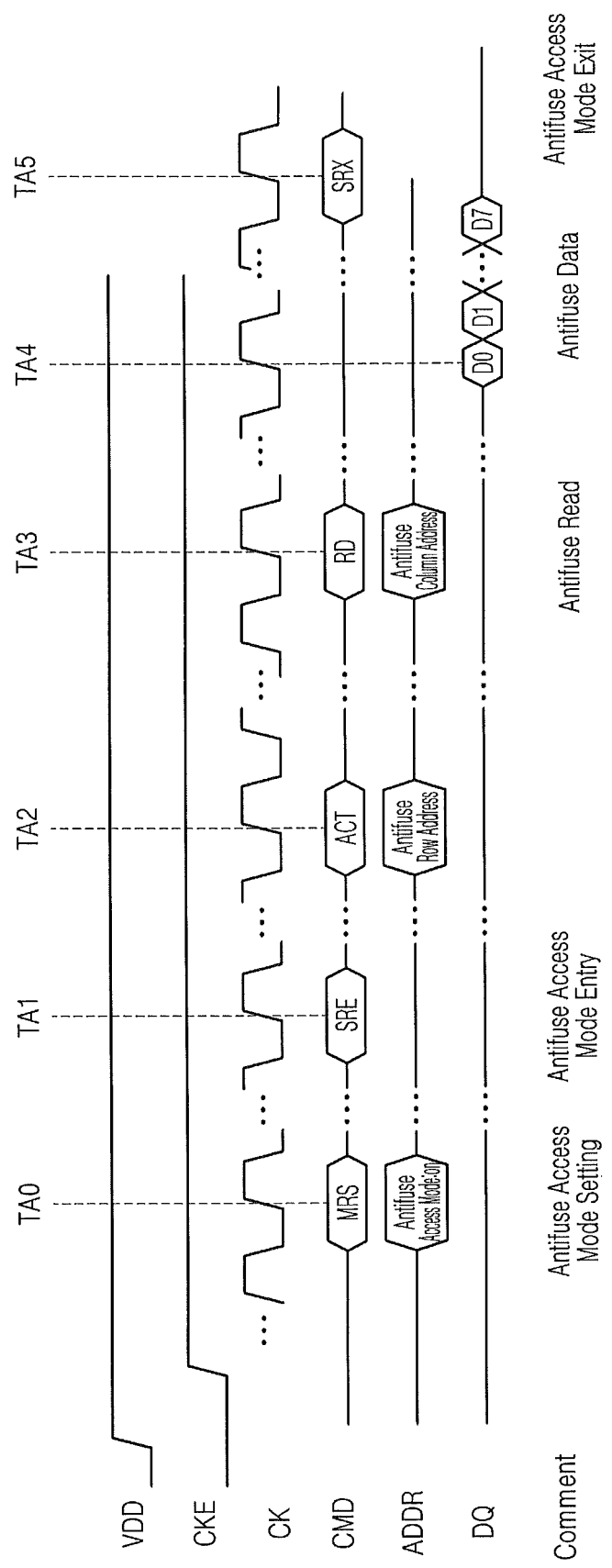
FIGS. 4 and 5 are timing diagrams illustrating operation modes of the memory device of FIG. 3.
Figure 5:
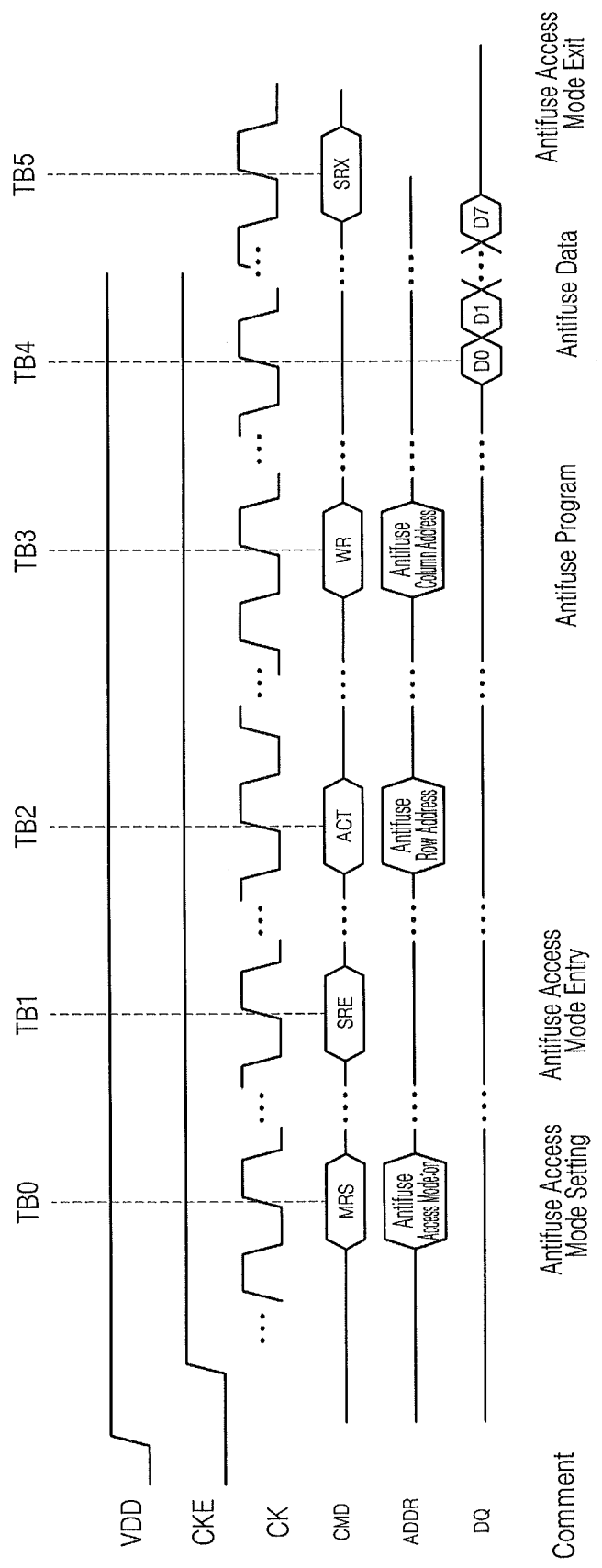

FIGS. 4 and 5 are timing diagrams illustrating operation modes of the memory device 110 of FIG. 3 according to embodiments of the inventive concept. FIG. 4 is the timing diagram illustrating a read mode of the antifuse circuit unit 112 in the memory device 110, and FIG. 5 is the timing diagram illustrating a program mode of the antifuse circuit unit 112.

Referring to FIG. 4 with reference to FIG. 3, a power voltage VDD is supplied to the memory device 110, a clock enable signal CKE is activated, and then a clock signal CK is input. When the power voltage VDD of the memory device 110 is stabilized, a power-up detection signal PVCCHB (not shown) in the memory device 110 is activated.

At a time TA0, an MRS command that is synchronized with a rising edge of the clock signal CK is received. The MRS command is a command for programming the operation modes of the memory device 110, which include a CAS latency, an addressing mode, a burst length, a test mode, a DLL reset, and various user-specified options. The MRS command is received together with an address signal ADDR that indicates a repair addressing mode for accessing the antifuse circuit unit 112.

At a time TA1, an SRE command that is synchronized with a rising edge of the clock signal CK is received. The SRE command is a refresh command for refreshing a plurality of pieces of data of memory cells in the memory cell array 111. Also, the SRE command may be used as a command for commanding a start of the read mode of the antifuse circuit unit 112.

At a time TA2, an active command ACT that is synchronized with a rising edge of the clock signal CK is received. The active command ACT is received together with an address signal ADDR that addresses a row address of the antifuse array in the antifuse circuit unit 112.

At a time TA3, a read command RD that is synchronized with a rising edge of the clock signal CK is received. The read command RD is received together with an address signal ADDR that addresses a column address of the antifuse array in the antifuse circuit unit 112.

At a time TA4, data, which is stored in an antifuse of the antifuse array which corresponds to the received row address and the received column address, is read in synchronization with a rising edge of the clock signal CK. The data stored in the antifuse is the defective cell address of the memory device 110. The data stored in the antifuse may be output by using at least one DQ signal from among data I/O signals DQ0 through DQ7. Also, the data stored in the antifuse may be output by using a DQ signal corresponding to a burst length BL of the memory device 110.

At a time TA5, an SRX command that is synchronized with a rising edge of the clock signal CK is received. The SRX command is a refresh command for exiting a refresh operation of the memory cells in the memory cell array 111. Also, the SRX command may be used as a command for commanding an end of the read mode of the antifuse circuit unit 112.

In the memory device 110, the read mode of the antifuse circuit unit 112 is started by the SRE command and is ended by the SRX command. In the antifuse array in the antifuse circuit unit 112, a row address is addressed in response to the address signal ADDR that is received with the active command ACT, and a column address is addressed in response to the address signal ADDR that is received with the read command RD. The antifuse array synchronizes a rising edge of the clock signal CK with a defective cell address stored in antifuses corresponding to the row address and the column address, and reads the defective cell address by using a data I/O signal DQ.

Hereinafter the program mode of the antifuse circuit unit 112 of FIG. 5 will be described with reference to FIG. 3. A power voltage VDD is supplied to the memory device 110, a clock enable signal CKE is activated, and then a clock signal CK is input. When the power voltage VDD of the memory device 110 is stabilized, a power-up detection signal PVCCHB (not shown) in the memory device 110 is activated.

At a time TB0, an MRS command that is synchronized with a rising edge of the clock signal CK is received. The MRS command is a command for programming the operation modes of the memory device 110, which include a CAS latency, an addressing mode, a burst length, a test mode, a DLL reset, and various user-specified options. The MRS command is received together with an address signal ADDR that indicates a repair addressing mode for accessing the antifuse circuit unit 112.

At a time TB1, an SRE command that is synchronized with a rising edge of the clock signal CK is received. The SRE command is a refresh command for refreshing a plurality of pieces of data of memory cells in the memory cell array 111. Also, the SRE command may be used as a command for commanding a start of the program mode of the antifuse circuit unit 112.

At a time TB2, an active command ACT that is synchronized with a rising edge of the clock signal CK is received. The active command ACT is received together with an address signal ADDR that addresses a row address of the antifuse array in the antifuse circuit unit 112.

At a time TB3, a write command WR that is synchronized with a rising edge of the clock signal CK is received. The write command WR is received together with an address signal ADDR that addresses a column address of the antifuse array in the antifuse circuit unit 112.

At a time TB4, data that is received by using a data I/O signal DQ in synchronization with a rising edge of the clock signal CK is programmed to antifuses in the antifuse array which correspond to the row address and the column address. The data that is received by using the data I/O signal DQ may be an address of a defective cell that occurs when the memory device 110 is tested or may be an address of a defective cell that occurs while the memory device 110 is mounted to and operates in the memory module 100. The defective cell address may be received by using at least one DQ signal from among data I/O signals DQ0 through DQ7.

At a time TB5, an SRX command that is synchronized with a rising edge of the clock signal CK is received. The SRX command is a refresh command for exiting a refresh operation of the memory cells in the memory cell array 111. Also, the SRX command may be used as a command for commanding an end of the program mode of the antifuse circuit unit 112.

Figure 6:
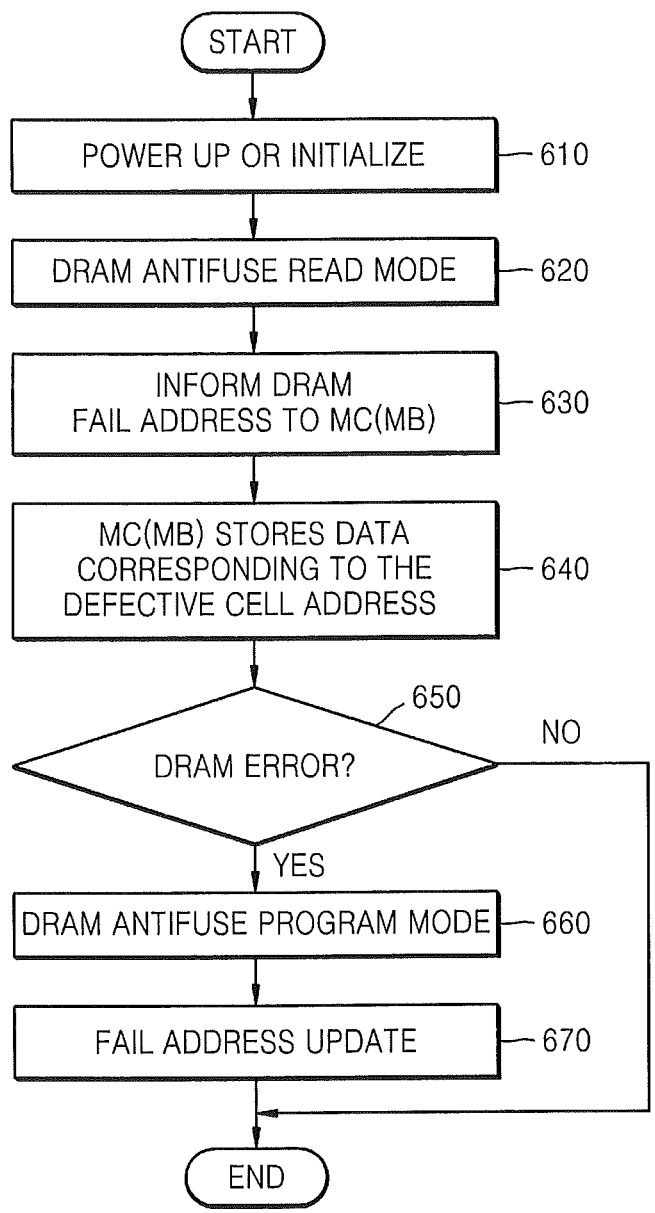
FIG. 6 is a flowchart describing a method of operating a memory module of FIG. 1.

FIG. 6 is a flowchart describing a method of operating the memory module 100 of FIG. 1 according to an embodiment of the inventive concept.

Referring to FIG. 6, while the memory module 100 is powered up or is initialized (operation 610), a power voltage VDD of the memory device 110 is stabilized and thus a power-up detection signal PVCCHB (not shown) is activated. Then, the memory device 110 reads a defective cell address stored in the antifuse circuit unit 112 via the addressing selecting unit 118, in response to a selection signal SEL that is provided from the MRS decoder 115 (operation 620). The read defective cell address is output by using a data I/O signal DQ via the data output buffer 113*c*, is transmitted to the memory buffer 120 via the first data I/O bus 114, and then is noticed (operation 630).

The memory buffer 120 stores data, which corresponds to the defective cell address, in the logic circuit unit 124 (operation 640). Afterward, when an error is incurred by a new defective cell in the memory device 110 while the memory module 100 operates (operation 650), the memory device 110 receives an address signal ADDR with respect to the new defective cell via the address input buffer 113*b*, and programs an antifuse of the antifuse circuit unit 112 according to an address of the new defective cell, in response to a second addressing enable signal EN2 that is provided from the MRS decoder 115 (operation 660). By doing so, the address of the new defective cell is updated to the antifuse circuit unit 112 (operation 670).

Figure 7:
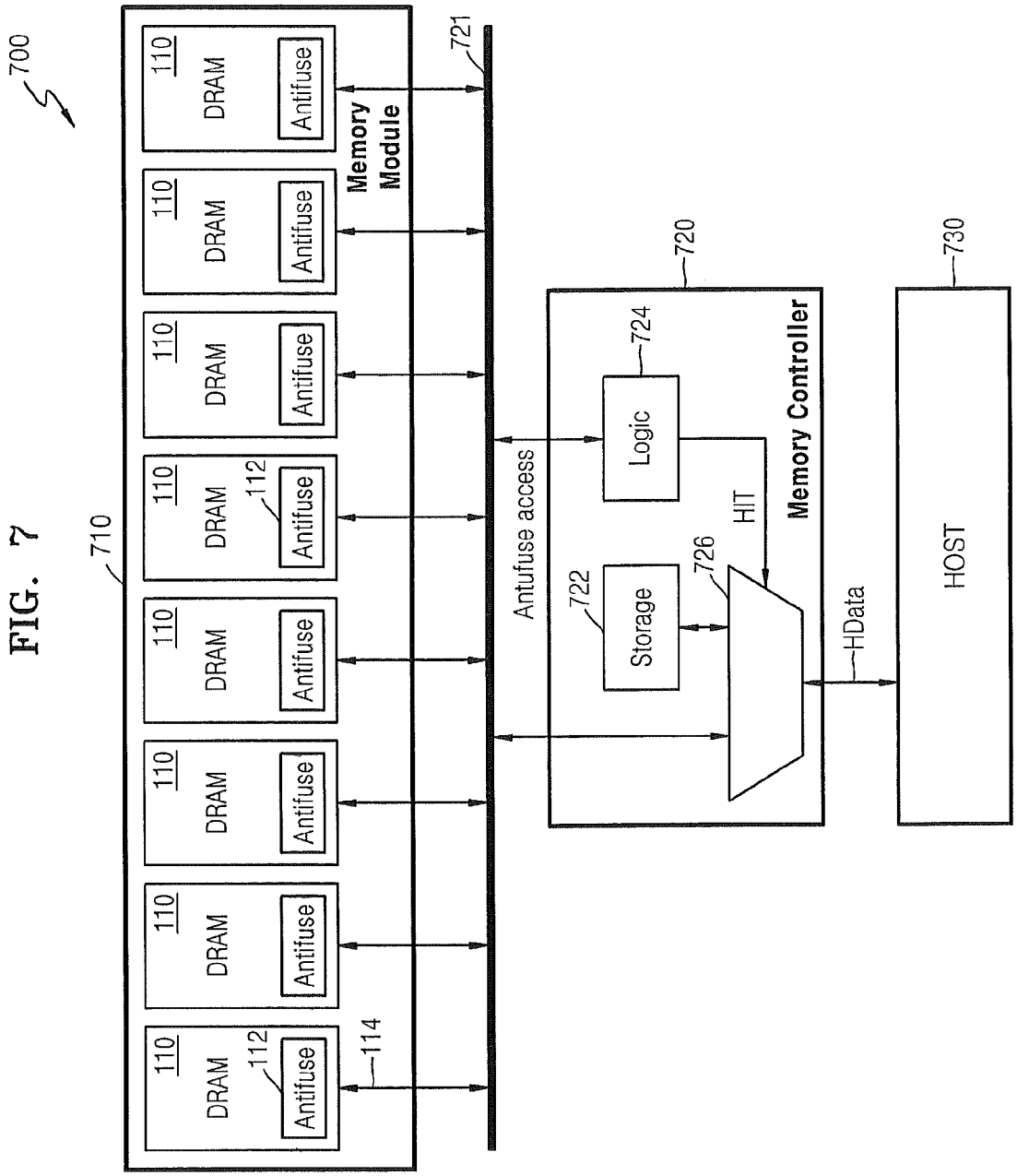
FIG. 7 is a diagram of a memory system including the memory device, according to an embodiment of the inventive concept.

FIG. 7 is a diagram of a memory system 700 including the memory device 110, according to an embodiment of the inventive concept.

Referring to FIG. 7, the memory system 700 includes a memory module 710, a memory controller 720, and a host central processing unit host (CPU) 730. The memory module 710 includes a plurality of memory devices 110. Each of the memory devices 110 may be the same as the memory device 110 described above with reference to FIGS. 1 and 3, and may include an antifuse circuit unit 112 capable of updating and storing a defective cell address.

When the memory device 110 is powered up or is initialized, the memory device 110 may read the defective cell address stored in the antifuse circuit unit 112 and may output the defective cell address via a first data I/O bus 114. A second data I/O bus 721 may be connected to the first data I/O bus 114 of each memory device 110. For example, in a case where the first data I/O bus 114 is formed of eight data I/O signal (DQ) lines, and eight memory devices 110 are mounted, the second data I/O bus 721 may be formed of sixty-four I/O signal (DQ) lines.

The host CPU 730 reads or writes data of a memory of the memory device 110 in the memory module 710 via the memory controller 720. The host CPU 730 does not directly read or write the memory device 110, but transmits a command/address signal including a read or write command and an address signal, and data HDATA to the memory controller 720. Also, the host CPU 730 receives data HDATA that is transmitted from the memory controller 720.

The memory controller 720 includes a storage unit 722, a logic circuit unit 724, and a second selecting unit 726. The storage unit 722 may store data to be written to a defective cell address detected when the memory device 110 is tested. Also, the storage unit 722 may store data to be written to a defective cell address that newly occurs while the memory system 700 operates. Accordingly, the storage unit 722 may update and store data to be written to a defective cell address that occurs during testing and when the memory module is placed into operation in a system.

The logic circuit unit 724 determines whether an address transmitted from the host CPU 730 is a defective cell address in the memory device 110. The logic circuit unit 724 may include a fail address table 826 (refer to FIG. 8) for storing a defective cell address, and an address comparing unit 827 (refer to FIG. 8) for comparing the address transmitted from the host CPU 730 with the defective cell address stored in the fail address table 826 (refer to FIG. 8). The logic circuit unit 724 may generate a hit signal HIT indicating that the transmitted address and the defective cell address match each other. The logic circuit unit 724 may be connected to at least one data I/O signal DQ via the second data I/O bus 121 (refer to FIG. 1).

When the hit signal HIT is activated, the second selecting unit 726 writes data to the storage unit 722, wherein the data is intended to be written to a defective memory cell in the memory device 110. Also, when the hit signal HIT is activated, the second selecting unit 726 reads data from the storage unit 722, instead of from the defective memory cell.

The storage unit 722 may include only one register so as to rescue only one defective cell in the memory module 100. Alternatively, the storage unit 722 may include a plurality of registers so as to rescue a plurality of defective cells. This is because at least two memory devices 110 may be defective or two defects may occur in one memory device 110.

When there is a request for an access to a defective cell in the memory device 110, the memory controller 720 accesses the storage unit 722, instead of accessing the defective cell. Data that is intended to be written to the defective cell is instead written to the storage unit 722. When the defective cell is read, read data is not read from the defective cell but is read from the storage unit 722.

Figure 8:
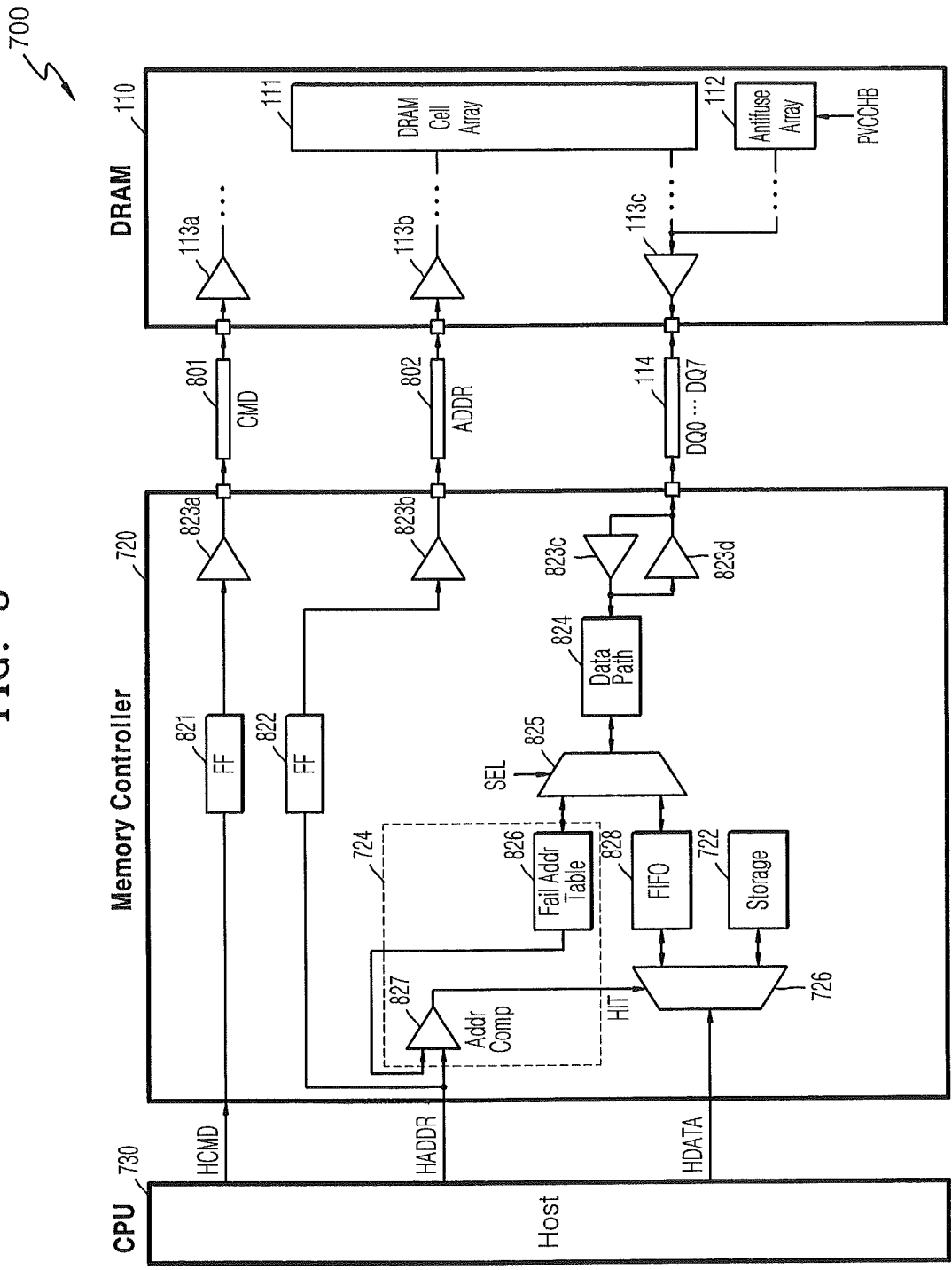
FIG. 8 is a block diagram illustrating the memory system of FIG. 7.

FIG. 8 is a block diagram illustrating the memory system 700 of FIG. 7 according to an embodiment of the inventive concept.

Referring to FIG. 8, the memory controller 720 that is connected to one memory device 110 from among the plurality of memory devices 110 mounted in the memory module 710 in the memory system 700 of FIG. 7 will be described in detail. The memory device 110 is the same as the memory device 110 described above with reference to FIG. 3. To avoid redundancy of description, detailed descriptions of the memory device 110 are omitted.

The memory controller 720 may include a first flip-flop 821 that stores a command HCMD received from the host CPU 730. The command HCMD stored in the first flip-flop 821 is transmitted to a command transmission line 801 via a command output buffer 823a. The memory device 110 receives a command CMD, which is transmitted to the command transmission line 801, via a command input buffer 113a.

The memory controller 720 may include a second flip-flop 822 that stores an address HADDR received from the host CPU 730. The address HADDR stored in the second flip-flop 822 is transmitted to an address transmission line 802 via an address output buffer 823b. The memory device 110 receives an address ADDR, which is transmitted to the address transmission line 802, via an address input buffer 113b.

The memory controller 720 may include the logic circuit unit 724 that determines whether the address HADDR received from the host CPU 730 is a defective cell address in the memory device 110. The logic circuit unit 724 includes the fail address table 826 and the address comparing unit 827. The defective cell address is stored in the fail address table 826. The address comparing unit 827 may be formed as an exclusive OR circuit for comparing the address HADDR received from the host CPU 730 with the defective cell address stored in the fail address table 826. When the address HADDR received from the host CPU 730 matches the defective cell address stored in the fail address table 826, the address comparing unit 827 may generate a hit signal HIT.

The fail address table 826 receives and stores a defective cell address that is read from the antifuse circuit unit 112 in the memory device 110. The memory device 110 outputs defective cell addresses stored in the antifuse array of the antifuse circuit unit 112, in response to a power-up detection signal PVCCHB, and transmits the defective cell address by using a data I/O signal DQ to the first data I/O bus 114. The memory controller 720 transmits the defective cell address, which is transmitted to the first data I/O bus 114, to a data path 824 via a data input buffer 823c, and stores the defective cell address in the fail address table 826 via a first selecting unit 825 in response to a selection signal SEL.

The selection signal SEL of the memory controller 720 may be equally activated with a selection signal SEL of the memory device 110. In response to activation of the selection signal SEL, the memory device 110 outputs the defective cell address, which is output from the antifuse circuit unit 112, to the first data I/O bus 114. In synchronization with the output from the antifuse circuit unit 112 via the first data I/O bus 114, the selection signal SEL of the memory controller 720 may be activated so that the defective cell address may be stored in the fail address table 826.

The memory device 110 may transmit read data, which is output from the memory cell array 111, to the first data I/O bus 114 by using a data I/O signal DQ. The memory controller 720 receives the read data, which is output from the memory cell array 111 and is transmitted to the first data I/O bus 114, via the data input buffer 823c. The data path 824 transmits the read data, which is output from the memory cell array 111, to the first selecting unit 825, and the first selecting unit 825 transmits the read data, which is output from the memory cell array 111, to a first-in first-out (FIFO) unit 828, in response to deactivation of a selection signal SEL. The FIFO unit 828 stores the read data that is output from the memory cell array 111.

The storage unit 722 may store data to be written to the defective cell address that is stored in the fail address table 826. The second selecting unit 726 may select the read data stored in the FIFO unit 828 or the data to be written to the defective cell address which is stored in the storage unit 722, and may transmit selected data to the host CPU 730, in response to the hit signal HIT that is generated by the logic circuit unit 724. For example, the second selecting unit 726 may transmit the data to be written to the defective cell address, which is stored in the storage unit 722, to the host CPU 730, in response to activation of the hit signal HIT, and may transmit the read data stored in the FIFO unit 828 to the host CPU 730, in response to deactivation of the hit signal HIT. The read data stored in the FIFO unit 828 or the data stored in the storage unit 722, which is selected by the second selecting unit 726, may be transmitted as the data HDATA of the host CPU 730.

The memory controller 720 may receive the data HDATA of the host CPU 730 via the second selecting unit 726, and may transmit the data HDATA to the first data I/O bus 114 via the FIFO unit 828, the first selecting unit 825, the data path 824, a data output buffer 823d, and a data I/O signal DQ. The data HDATA that is transmitted to the first data I/O bus 114 may be input to the data input buffer 113d of the memory device 110.

In the present embodiment, the memory controller 720 rescues a defective cell that occurs in the memory device 110. The memory device 110 may store a defective cell address in the antifuse circuit unit 112 and may output the defective cell address to the memory controller 720. The memory controller 720 may store the output defective cell address in the fail address table 826, and may compare the output defective cell address with an address HADDR received from the memory controller 720. As a result of the comparison, when they match each other, the memory controller 720 may store data, which is intended to be written to the defective cell address, in the storage unit 72, and may read it.

In the memory device 110, a timing parameter spec., a refresh spec., an I/O trigger voltage spec., and a data training spec. of the memory device 110 may deviate due to a change in a power voltage VDD or in a temperature.

The timing parameter spec. includes a tRCD parameter, a tRP parameter, a tRAS parameter, and a tAA parameter. The tRCD parameter indicates a time period from application of a /RAS signal to application of a /CAS signal, and means the time period between a row active command and a column active command. The tRP parameter indicates a time period in which a bitline is precharged to prepare a next active command after a tWR time period passes. A tWR parameter indicates a time at which data is written to a memory cell after a wordline is enabled. The tRAS parameter indicates a row active time. The tAA parameter indicates a time period between an address input and an access to output data.

The refresh spec. includes a tRFC parameter, a tREFI parameter, and the like. The tRFC parameter indicates a refresh row cycle time. The tREFI parameter indicates a refresh interval. The I/O trigger voltage spec. indicates a trigger point voltage, i.e., a level of a reference voltage VREF in a single ended signalling method. According to the level of the trigger point voltage, tDQSQ, tDQSCK, tDS, and tDH parameters may be affected. The tDQSQ parameter indicates a time period between a data strobe edge and an output data edge. The tDQSCK parameter indicates a time period from a clock signal CK/$\overline{CK}$ to a DQS output access time. The tDS parameter indicates a DQ and DM set-up time with respect to DQS. The tDH parameter indicates a DQ and DM hold time with respect to DQS.

The data training spec. controls a calibration operation that is performed to allow a middle point of a data window to be positioned at a cross point of a rising edge and a falling edge of the clock signal CK/$\overline{CK}$. Due to a layout of wiring, a difference in signal driving functions, or the like, a signal propagation time difference between the clock signal CK/$\overline{CK}$ and data may occur. Due to that difference, the middle point of the data window may not match the rising edge and the falling edge of the clock signal CK/$\overline{CK}$, such that a timing margin of the data is decreased.

The memory device 110 may code information related to the timing parameter spec., the refresh spec., the I/O trigger voltage spec., or the data training spec. and may store the information in the antifuse circuit unit 112. For example, the antifuse circuit unit 112 of the memory device 110 may store the tRCD, tRP, tRAS, and tAA parameters related to the timing parameter spec. The antifuse circuit unit 112 of the memory device 110 may store the tRFC and tREFI parameters related to the refresh spec. Also, the antifuse circuit unit 112 of the memory device 110 may store the calibration information related to the data training spec.

The memory device 110 may store the information related to the timing parameter spec., the refresh spec., the I/O trigger voltage spec., or the data training spec. in the antifuse circuit unit 112, and may read the information to the memory controller 720. The memory controller 720 may perform a correction operation so as to satisfy the read timing parameter spec., the refresh spec., the I/O trigger voltage spec., or the data training spec., and, thus, may correct defective characteristics of the memory device 110.

Figure 9:
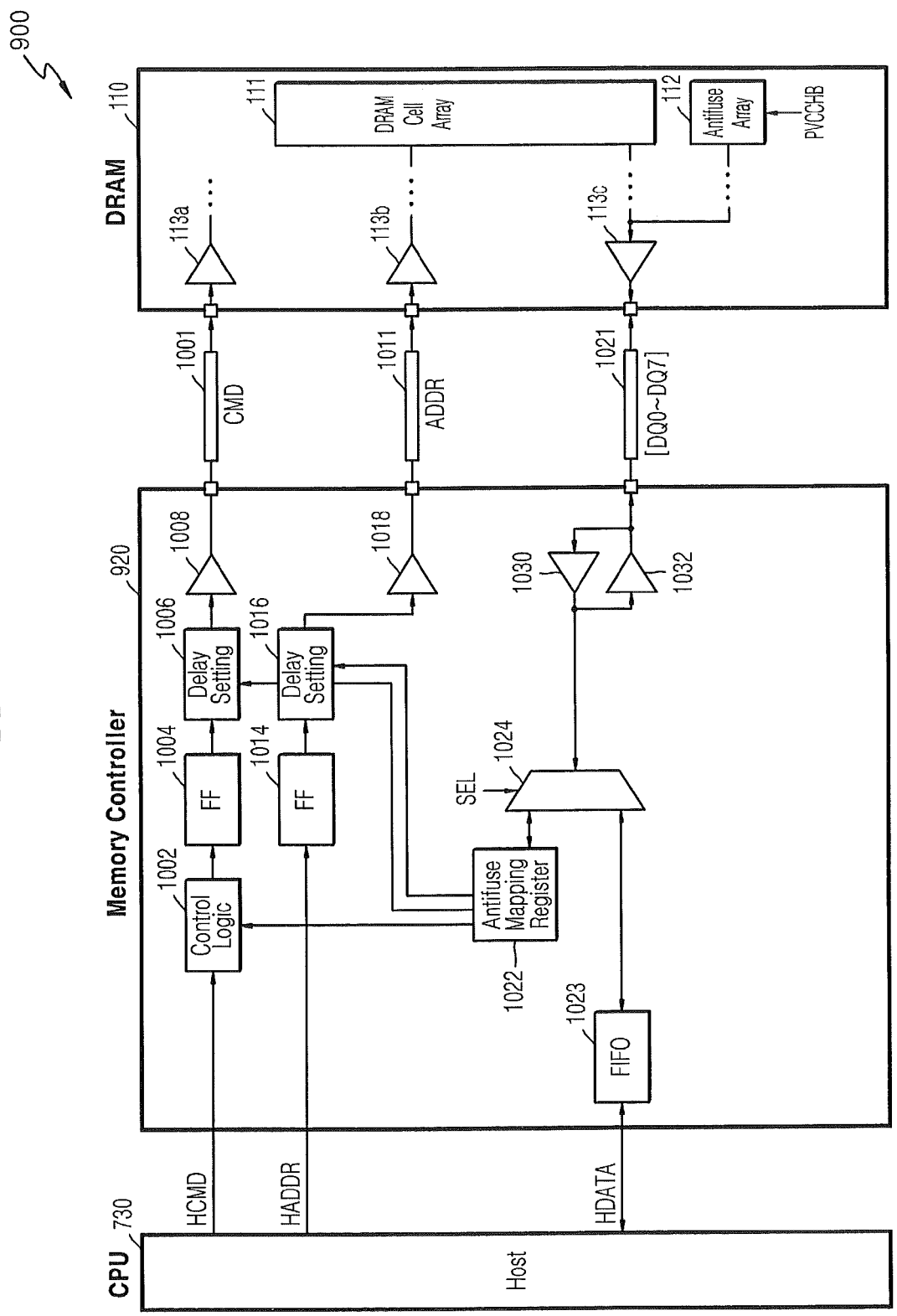
FIG. 9 a diagram of a memory system including the memory device, according to another embodiment of the inventive concept.

FIG. 9 is a diagram of a memory system 900 including the memory device 110, according to another embodiment of the inventive concept.

Referring to FIG. 9, a memory controller 920 of the memory system 900, which is connected to one memory device 110 from among the plurality of memory devices 110 mounted in the memory module 710 of FIG. 7 will be described in detail. The memory device 110 is the same as the memory device 110 described above with reference to FIG. 3. To avoid redundancy of description, detailed descriptions of the memory device 110 are omitted.

The memory controller 920 may include a control logic 1002 for receiving a command HCMD requested by the host CPU 730, a first flip-flop 1004 for storing the command HCMD received by the control logic 1002, a first delay setting unit 1006 for controlling an output time of the command HCMD stored in the first flip-flop 1004, and a command output buffer 1008 for transmitting an output from the first delay setting unit 1006 to a command transmission line 1001.

The control logic 1002 may control timing for reception of the command HCMD of the host CPU 730, in response to timing-related codes that are stored in an antifuse mapping register 1022. The first delay setting unit 1006 may control the output time of the command HCMD stored in the first flip-flop 1004, in response to the timing-related codes that are stored in the antifuse mapping register 1022. The first delay setting unit 1006 may satisfy the timing parameter spec. or the refresh spec. of the memory device 110 by controlling the output time of the command HCMD.

The memory controller 920 may include a second flip-flop 1014 for receiving and storing an address HADDR requested by the host CPU 730, a second delay setting unit 1016 for controlling an output time of the address HADDR stored in the second flip-flop 1014, and an address output buffer 1018 for transmitting an output from the second delay setting unit 1016 to an address transmission line 1011.

The second delay setting unit 1016 may control the output time of the address HADDR stored in the second flip-flop 1014, in response to the timing-related codes that are stored in the antifuse mapping register 1022. The second delay setting unit 1016 may satisfy the timing parameter spec. or the refresh spec. of the memory device 110 by controlling the output time of the address HADDR.

The memory controller 920 may include the antifuse mapping register 1022, a FIFO unit 1023, a selecting unit 1024, a data input buffer 1030, and a data output buffer 1032. The data input buffer 1030 may receive data via a data I/O bus 1021, and may transmit the data to the selecting unit 1024.

The data received via the data I/O bus 1021 may be an antifuse code related to the timing parameter spec. or the refresh spec., which is output from the antifuse circuit unit 112 of the memory device 110. Also, the data that is received via the data I/O bus 1021 may be read data output from the memory cell array 111 of the memory device 110.

The antifuse circuit unit 112 of the memory device 110 may be formed as the antifuse array in which the antifuses 2 (refer to FIG. 2) are matrix-arrayed. As shown in Table 1, the antifuse circuit unit 112 may store the tRCD, tRP, tRAS, and tAA parameters, which are timing parameters, in address regions, respectively.

TABLE 1

|  | Antifuse address | Description |
|---|---|---|
| AC parameter | 000111~000000 | tRCD |
|  | 001111~001000 | tRP |
|  | 010111~010000 | tRAS |
|  | 011111~011000 | tAA |

For example, the tRCD parameters may be stored in the regions of the antifuse addresses 000000 through 000111, the tRP parameters may be stored in the regions of the antifuse addresses 001000 through 001111, the tRAS parameters may be stored in the regions of the antifuse addresses 010000 through 011111, and the tAA parameters may be stored in the regions of the antifuse addresses 100000 through 111111.

As shown in Table 2, the antifuse circuit unit 112 may store the tRFC and tREFI parameters, which are refresh parameters, in address regions, respectively. The antifuse circuit unit 112 may be set to include address regions for defining defective cell addresses, and address regions for storing the I/O trigger voltage spec.

TABLE 2

|  | Antifuse address | Description |
|---|---|---|
| Refresh parameter | 100111~100000 | tRFC |
|  | 101111~101000 | tREFI |
| Defective cell information | 110111~110000 | defective cell addresses |
| I/O trigger voltage spec. | 111111~111000 | levels of reference voltage Vref |

For example, the tRFC parameters may be stored in the regions of the antifuse addresses 100000 through 100111, and the tREFI parameters may be stored in the regions of the antifuse addresses 101000 through 101111. The defective cell addresses may be stored in the regions of the antifuse addresses 110000 through 110111. The reference voltage levels of the I/O trigger voltage spec. may be stored in the regions of the antifuse addresses 111000 through 111111. Unlike this, parameters related to the data training spec. may be stored in the address regions for storing the I/O trigger voltage spec.

As shown in Table 3, the tRCD parameter from among the timing parameters may be stored as an antifuse code, which corresponds to matching timing, in the regions of the antifuse addresses 000000 through 000111 of the antifuse circuit unit 112.

TABLE 3

|  | Antifuse code CODE | Description |
|---|---|---|
| tRCD | 0000000 | 12.5 ns |
|  | 0000001 | 12.52 ns |
|  | 0000010 | 12.54 ns |
|  | 0000011 | 12.56 ns |
|  | . . . | . . . |
|  | 1111101 | 13.48 ns |
|  | 1111110 | 13.5 ns |
|  | 1111111 | 13.52 ns |

For example, the antifuse code 0000000 stored in the antifuse circuit unit 112 indicates that the tRCD parameter is 12.5 ns, the antifuse code 0000001 stored in the antifuse circuit unit 112 indicates that the tRCD parameter is 12.52 ns, the antifuse code 0000010 stored in the antifuse circuit unit 112 indicates that the tRCD parameter is 12.54 ns, and the antifuse code 0000011 stored in the antifuse circuit unit 112 indicates that the tRCD parameter is 12.56 ns. Also, the antifuse code 1111101 indicates that the tRCD parameter is 13.48 ns, the antifuse code 1111110 indicates that the tRCD parameter is 13.5 ns, and the antifuse code 1111111 indicates that the tRCD parameter is 13.52 ns.

The antifuse code CODE may be read by the antifuse circuit unit 112, may be stored in the antifuse mapping register 1022, and then may be provided to the first and second delay setting units 1006 and 1016. The first delay setting unit 1006 may control a command output time, in response to the antifuse code CODE, and the second delay setting unit 1016 may control an address output time, in response to the antifuse code CODE. Accordingly, the first and second delay setting units 1006 and 1016 may satisfy the timing parameter spec. or the refresh spec. of the memory device 110. The first and second delay setting units 1006 and 1016 may be formed as shown in FIGS. 10A and 10B.

Figure 10A:
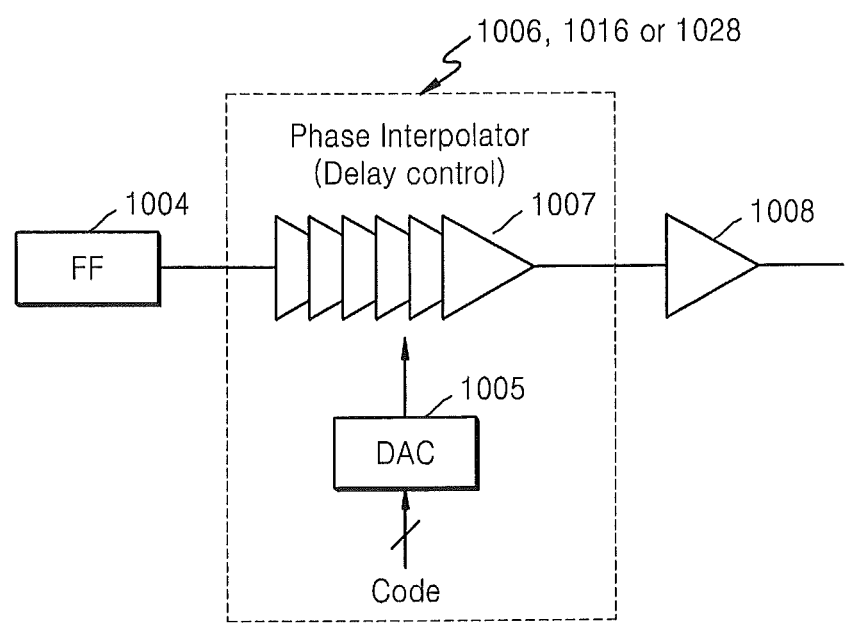
FIGS. 10A and 10B are diagrams illustrating delay setting units of FIG. 9.

Referring to FIG. 10A, the first delay setting unit 1006 may include a digital-to-analog converter (DAC) 1005 and a phase interpolator 1007. The DAC 1005 may receive the antifuse code CODE stored in the antifuse mapping register 1022 and may convert it into a predetermined voltage level. The phase interpolator 1007 may include a plurality of delay cells that are controlled by the voltage level output from the DAC 1005. The delay cells may delay an output from the first flip-flop 1004, thereby providing the output to the command output buffer 1008.

Figure 10B:
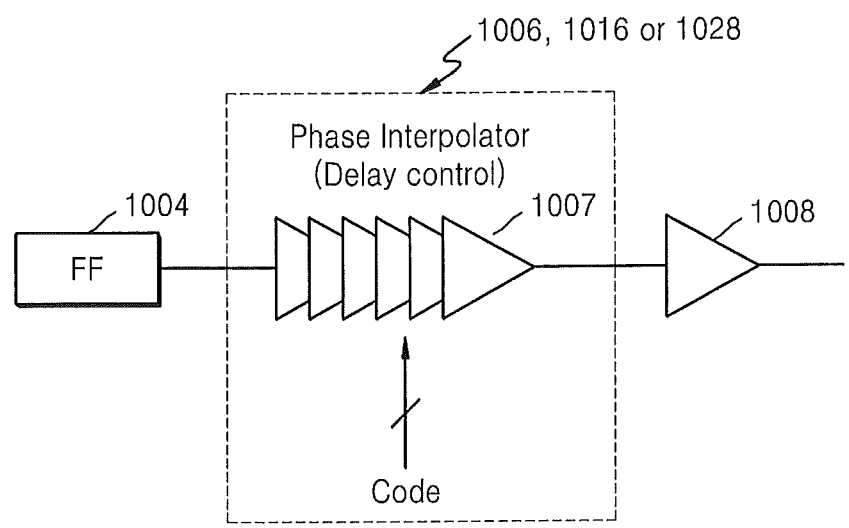

Referring to FIG. 10B, the first delay setting unit 1006 may include the phase interpolator 1007 that responds to the antifuse code CODE stored in the antifuse mapping register 1022. The phase interpolator 1007 may include the plurality of delay cells that respond to the antifuse code CODE. The delay cells may delay an output of a command stored in the first flip-flop 1004, thereby providing the command to the command output buffer 1008.

Similar to the first delay setting unit 1006, the second delay setting unit 1016 may include the DAC 1005 controlled by the antifuse code CODE and the phase interpolator 1007, or may include the phase interpolator 1007 that responds to the antifuse code CODE. The second delay setting unit 1016 may delay the address HADDR stored in the second flip-flop 1014 and thus may provide the address HADDR to the address output buffer 1018.

Figure 11:
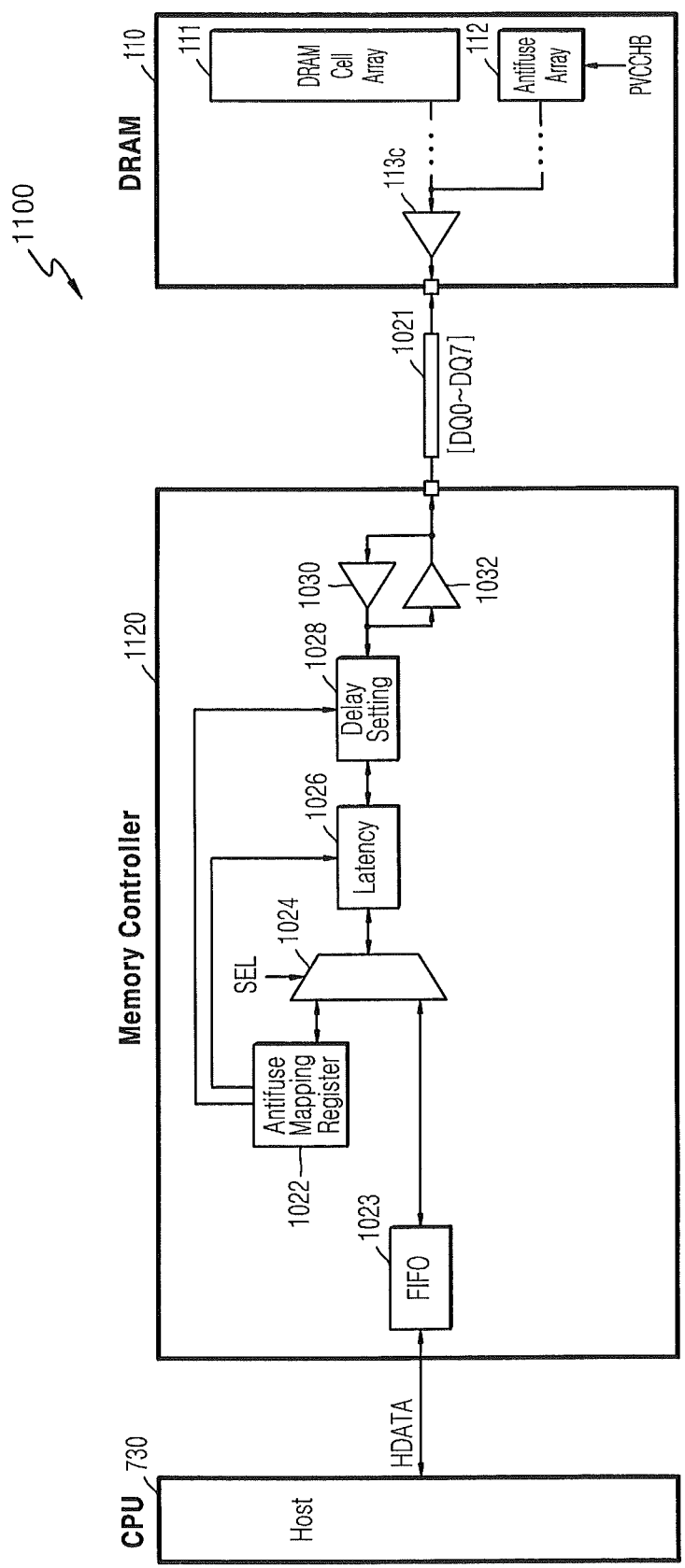
FIG. 11 is a diagram of a memory system including the memory device, according to another embodiment of the inventive concept.

FIG. 11 is a diagram of a memory system 1100 including the memory device 110, according to another embodiment of the inventive concept.

Referring to FIG. 11, a memory controller 1120 of the memory system 1100, which is connected to one memory device 110 from among the plurality of memory devices 110 mounted in the memory module 710 of FIG. 7, will be described in detail. The memory controller 1120 may include an antifuse mapping register 1022, a FIFO unit 1023, a selecting unit 1024, a latency control unit 1026, a third delay setting unit 1028, a data input buffer 1030, and a data output buffer 1032. The data input buffer 1030 may receive data via a data I/O bus 1021 and may transmit the data to the selecting unit 1024 via the third delay setting unit 1028 and the latency control unit 1026.

The data received via the data I/O bus 1021 may be a code related to an I/O trigger voltage spec. which is output from the antifuse circuit unit 112 of the memory device 110. Also, the data received via the data I/O bus 1021 may be read data output from the memory cell array 111 of the memory device 110.

As shown in Table 4, codes related to a tDQSQ parameter of the I/O trigger voltage spec. may be stored as antifuse codes that correspond to matching timing. The antifuse codes of the tDQSQ parameter may be stored in antifuse address regions of the antifuse circuit unit 112 in which the tDQSQ parameter is stored.

TABLE 4

|  | Antifuse code CODE | Description |
|---|---|---|
| tDQSQ | 0000000 | −25 ps |
|  | 0000001 | −24.5 ps |
|  | 0000010 | −24 ps |
|  | 0000011 | −23.5 ps |
|  | . . . | . . . |
|  | 1111101 | +24 ps |
|  | 1111110 | +24.5 ps |
|  | 1111111 | +25 ps |

For example, the antifuse code 0000000 of tDQSQ stored in the antifuse circuit unit 112 indicates that an output data edge precedes a data strobe edge by 25 ps, the antifuse code 0000001 indicates that the output data edge precedes the data strobe edge by 24.5 ps, the antifuse code 0000010 indicates that the output data edge precedes the data strobe edge by 24 ps, and the antifuse code 0000011 indicates that the output data edge precedes the data strobe edge by 23.5 ps. The antifuse code 1111101 indicates that the output data edge follows the data strobe edge by 24 ps, the antifuse code 1111110 indicates that the output data edge follows the data strobe edge by 24.5 ps, and the antifuse code 1111111 indicates that the output data edge follows the data strobe edge by 25 ps.

The third delay setting unit 1028 may control a transmission time of the data exchanged via the data I/O bus 1021, in response to the antifuse codes related to the I/O trigger voltage spec., which are stored in the antifuse mapping register 1022. The third delay setting unit 1028 may satisfy the I/O trigger voltage spec. of the memory device 110 by controlling the transmission time of the data.

The third delay setting unit 1028 may be configured the same as the first and second delay setting units 1006 and 1016 shown in FIGS. 10A and 10B. The third delay setting unit 1028 may include the DAC 1005 and the phase interpolator 1007 that are controlled by the antifuse code CODE, or may include the phase interpolator 1007 that responds to the antifuse code CODE.

The latency control unit 1026 may control a read latency, a write latency, or a CAS latency of the data exchanged via the data I/O bus 1021, in response to the antifuse codes related to the I/O trigger voltage spec. which are stored in the antifuse mapping register 1022. The latency control unit 1026 may satisfy the timing parameter spec. of the memory device 110 by controlling the read latency, the write latency, or the CAS latency.

The selecting unit 1024 transmits the data received via the data I/O bus 1021 to the antifuse mapping register 1022 or the FIFO unit 1023, in response to a selection signal SEL. For example, the selecting unit 1024 may transmit the antifuse code, which is related to the I/O trigger voltage spec. of the data I/O bus 1021, to the antifuse mapping register 1022, in response to activation of the selection signal SEL. For example, the selecting unit 1024 may transmit read data of the data I/O bus 1021 to the FIFO unit 1023, in response to deactivation of the selection signal SEL. The FIFO unit 1023 may store the read data and may transmit the read data as data HDATA to the host CPU 730.

The memory controller 1020 may transmit the data HDATA, which is received from the host CPU 730, to the data I/O bus 1021 via the FIFO unit 1023, the selecting unit 1024, the latency control unit 1026, the third delay setting unit 1028, and the data output buffer 1032. The data HDATA that is transmitted to the data I/O bus 1021 may be stored in the memory cell array 111 of the memory device 110.

Figure 12:
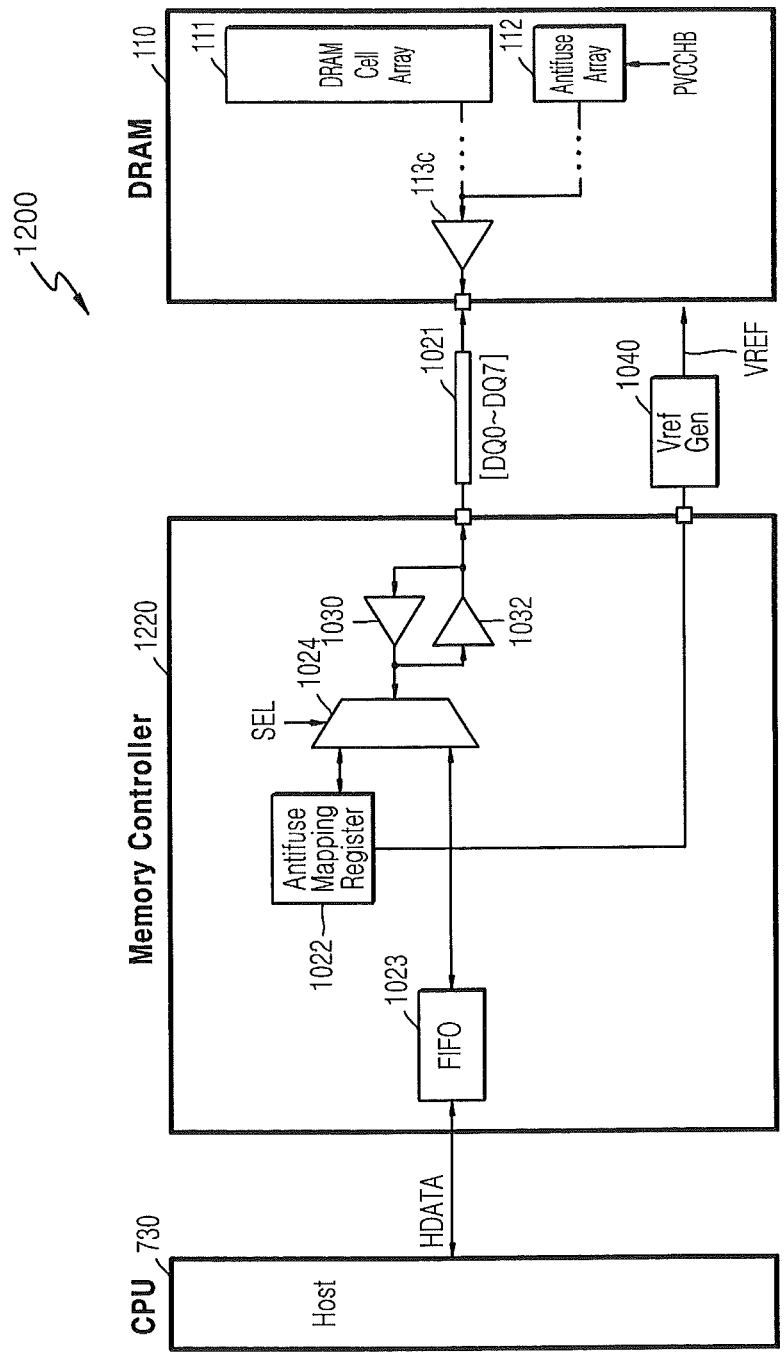
FIG. 12 is a diagram of a memory system including the memory device, according to another embodiment of the inventive concept.

FIG. 12 is a diagram of a memory system 1200 including the memory device 110, according to another embodiment of the inventive concept.

Referring to FIG. 12, a memory controller 1220 of the memory system 1200, which is connected to one memory device 110 from among the plurality of memory devices 110 mounted in the memory module 710 of FIG. 7, will be described in detail. The memory controller 1220 may include an antifuse mapping register 1022, a FIFO unit 1023, a selecting unit 1024, a data input buffer 1030, and a data output buffer 1032. The data input buffer 1030 may receive data via a data I/O bus 1021 and may transmit the data to the selecting unit 1024. The data that is received via the data I/O bus 1021 may be codes regarding levels of a reference voltage VREF related to an I/O trigger voltage spec. of the memory device 110, which is output from the antifuse circuit unit 112 of the memory device 110. Also, the data that is received via the data I/O bus 1021 may be read data output from the memory cell array 111 of the memory device 110.

As shown in Table 5, the codes regarding the levels of the reference voltage VREF related to the I/O trigger voltage spec. may be stored as antifuse codes that correspond to matching levels of the reference voltage VREF. The antifuse codes regarding the levels of the reference voltage VREF may be stored in antifuse address regions of the antifuse circuit unit 112 in which the reference voltage VREF is stored.

TABLE 5

| | Antifuse code CODE | Description |
|---|---|---|
| VREF | 0000000 | 720 mV |
| | 0000001 | 721 mV |
| | 0000010 | 722 mV |
| | 0000011 | 723 mV |
| | ... | ... |
| | 1111101 | 778 mV |
| | 1111110 | 779 mV |
| | 1111111 | 780 mV |

For example, the antifuse code 0000000 of the reference voltage VREF, which is stored in the antifuse circuit unit 112, indicates that the reference voltage VREF is 720 mV, the antifuse code 0000001 indicates that the reference voltage VREF is 721 mV, the antifuse code 0000010 indicates that the reference voltage VREF is 722 mV, and the antifuse code 0000011 indicates that the reference voltage VREF is 723 mV. Also, the antifuse code 1111101 indicates that the reference voltage VREF is 778 mV, the antifuse code 1111110 indicates that the reference voltage VREF is 779 mV, and the antifuse code 1111111 indicates that the reference voltage VREF is 780 mV.

The selecting unit 1024 transmits the data received via the data I/O bus 1021 to the antifuse mapping register 1022 or the FIFO unit 1023, in response to a selection signal SEL. For example, the selecting unit 1024 may transmit the antifuse code, which is related to the level of the reference voltage VREF of the data I/O bus 1021, to the antifuse mapping register 1022, in response to activation of the selection signal SEL. For example, the selecting unit 1024 may deliver read data of the data I/O bus 1021 to the FIFO unit 1023, in response to deactivation of the selection signal SEL. The FIFO unit 1023 may store the read data and may transmit the read data as data HDATA to the host CPU 730.

The memory controller 1220 may transmit the data HDATA, which is received from the host CPU 730, to the data I/O bus 1021 via the FIFO unit 1023, the selecting unit 1024, and the data output buffer 1032. The data HDATA that is transmitted to the data I/O bus 1021 may be stored in the memory cell array 111 of the memory device 110.

The antifuse codes of the reference voltage VREF, which are stored in the antifuse mapping register 1022, may be provided to a reference voltage generating circuit 1040. The reference voltage generating circuit 1040 may exist outside the memory controller 1220. Alternatively, the reference voltage generating circuit 1040 may exist in the memory controller 1220. The reference voltage generating circuit 1040 may adjust the levels of the reference voltage VREF, in response to the antifuse codes of the reference voltage VREF. The reference voltage VREF generated in the reference voltage generating circuit 1040 may satisfy the I/O trigger voltage spec. of the memory device 110.

Figure 13:
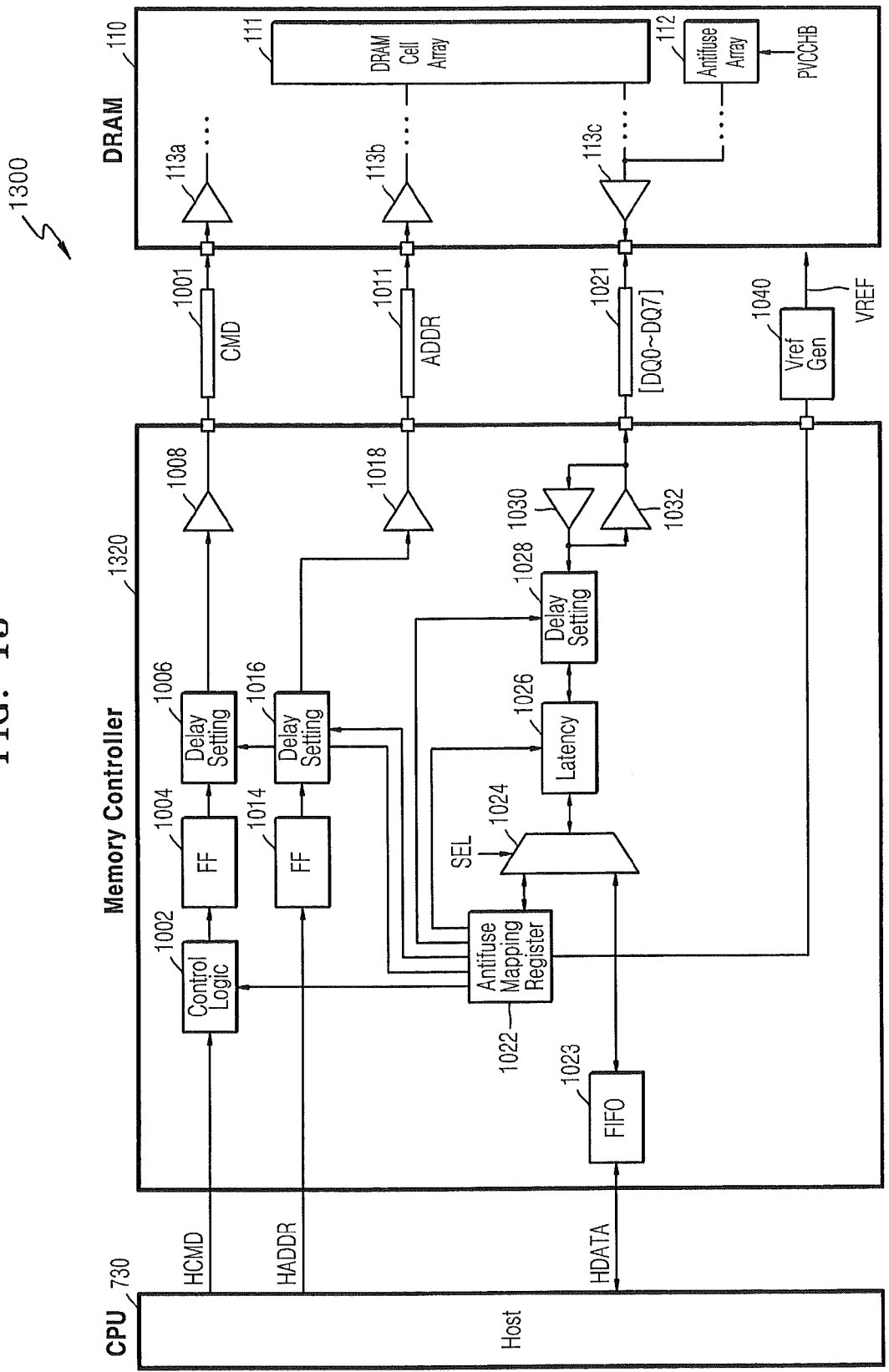
FIG. 13 is a diagram of a memory system including the memory device, according to another embodiment of the inventive concept.

FIG. 13 is a diagram of a memory system 1300 including the memory device 110, according to another embodiment of the inventive concept.

Referring to FIG. 13, a memory controller 1320 of the memory system 1300, which is connected to one memory device 110 from among the plurality of memory devices 110 mounted in the memory module 710 of FIG. 7, will be described in detail. The memory controller 1320 may include a control logic 1002 that receives a command HCMD requested by a host CPU 730, a first flip-flop 1004 that stores the command HCMD received by the control logic 1002, a first delay setting unit 1006 that controls an output time of the command HCMD stored in the first flip-flop 1004, and a command output buffer 1008 that sends an output from the first delay setting unit 1006 to the command transmission line 1001.

The control logic 1002 may control timing to receive the command HCMD of the host CPU 730, in response to timing-related codes stored in an antifuse mapping register 1022. The first delay setting unit 1006 may control the output time of the command HCMD stored in the first flip-flop 1004, in response to the timing-related codes stored in the antifuse mapping register 1022. The first delay setting unit 1006 may control the output time of the command HCMD stored in the first flip-flop 1004, in response to the timing-related codes stored in the antifuse mapping register 1022. The first delay setting unit 1006 may satisfy a timing parameter spec. or a refresh spec. of the memory device 110 by controlling the output time of the command HCMD.

The memory controller 1320 may include a second flip-flop 1014 for receiving and storing an address HADDR requested by the host CPU 730, a second delay setting unit 1016 for controlling an output time of the address HADDR stored in the second flip-flop 1014, and an address output buffer 1018 for transmitting an output from the second delay setting unit 1016 to an address transmission line 1011.

The second delay setting unit 1016 may control the output time of the address HADDR stored in the second flip-flop 1014, in response to the timing-related codes stored in the antifuse mapping register 1022. The second delay setting unit 1016 may satisfy the timing parameter spec. or the refresh spec. of the memory device 110 by controlling the output time of the address HADDR.

The memory controller 1320 may include the antifuse mapping register 1022, a FIFO unit 1023, a selecting unit 1024, a latency control unit 1026, a third delay setting unit 1028, a data input buffer 1030, and a data output buffer 1032. The data input buffer 1030 may receive data via a data I/O bus 1021 and may transmit the data to the selecting unit 1024 via the third delay setting unit 1028 and the latency control unit 1026.

The data received via the data I/O bus 1021 may be codes related to the timing parameter spec., the refresh spec., an I/O trigger voltage spec., or a data training spec., which is output from the antifuse circuit unit 112 of the memory device 110. Also, the data received via the data I/O bus 1021 may be read data output from the memory cell array 111 of the memory device 110.

The third delay setting unit 1028 may control a transmission time of the data exchanged via the data I/O bus 1021, in response to the timing-related codes stored in the antifuse mapping register 1022. The third delay setting unit 1028 may satisfy the data training spec. of the memory device 110 by controlling the transmission time of the data.

The latency control unit 1026 may control a read latency, a write latency, or a CAS latency of the data exchanged via the data I/O bus 1021, in response to the timing-related codes stored in the antifuse mapping register 1022. The latency control unit 1026 may satisfy the timing parameter spec. of the memory device 110 by controlling the read latency, the write latency, or the CAS latency.

The selecting unit 1024 transmits the data received via the data I/O bus 1021 to the antifuse mapping register 1022 or the FIFO unit 1023, in response to a selection signal SEL. For example, the selecting unit 1024 may transmit the codes related to the timing parameter spec., the refresh spec., the I/O trigger voltage spec., or the data training spec. of the data I/O bus 1021, to the antifuse mapping register 1022, in response to activation of the selection signal SEL. For example, the selecting unit 1024 may transmit read data of the data I/O bus 1021 to the FIFO unit 1023, in response to deactivation of the selection signal SEL. The FIFO unit 1023 may store the read data and may transmit the read data as data HDATA to the host CPU 730.

The antifuse mapping register 1022 may store the codes related to the timing parameter spec., the refresh spec., the I/O trigger voltage spec., or the data training spec. of the memory device 110. The I/O trigger voltage spec. stored in the antifuse mapping register 1022 may be provided to a reference voltage generating circuit 1040. The reference voltage generating circuit 1040 may exist outside the memory controller 1220. Alternatively, the reference voltage generating circuit 1040 may exist in the memory controller 1220. The reference voltage generating circuit 1040 may adjust levels of a reference voltage VREF, in response to antifuse codes related to the I/O trigger voltage spec. The reference voltage generating circuit 1040 may satisfy the I/O trigger voltage spec. of the memory device 110.

The memory controller 1320 may transmit the data HDATA, which is received from the host CPU 730, to the data I/O bus 1021 via the FIFO unit 1023, the selecting unit 1024, the latency control unit 1026, the third delay setting unit 1028, and the data output buffer 1032. The data HDATA transmitted to the data I/O bus 1021 may be input to the memory device 110.

FIGS. 9 through 13 illustrate the memory controllers 920, 1120, 1220, and 1320 that perform a correction so as to satisfy the timing parameter spec., the refresh spec., the I/O trigger voltage spec., and/or the data training spec. of the memory device 110, in response to the antifuse codes stored in the antifuse circuit unit 112 of the memory device 110. The correction by the memory controllers 920, 1120, 1220, and 1320 may also be performed in a memory buffer mounted in a memory module in other embodiments.

Figure 14:
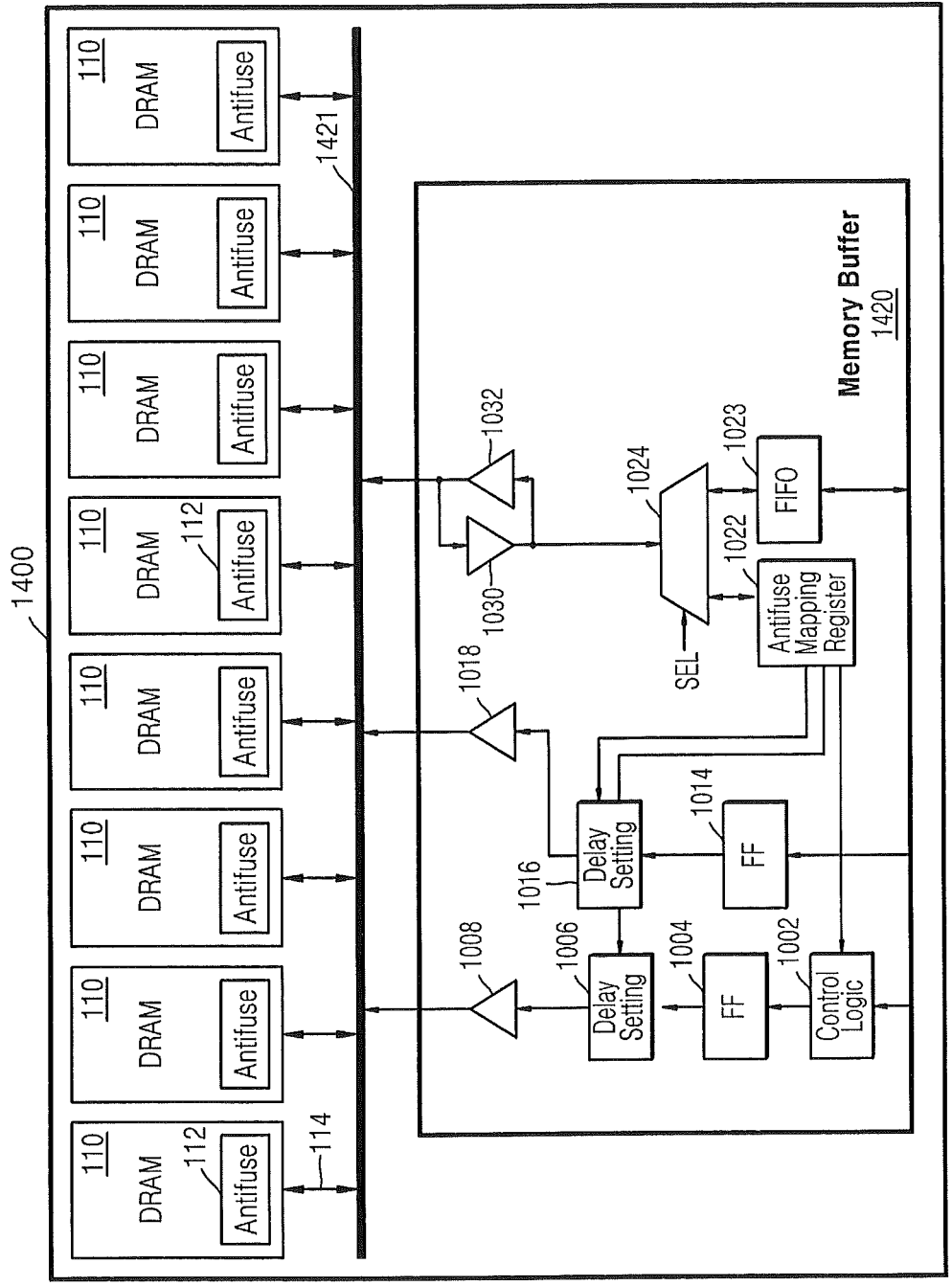
FIG. 14 is a diagram of a memory module including a plurality of memory devices, according to another embodiment of the inventive concept.

FIG. 14 is a diagram of a memory module 1400 including a plurality of memory devices 110, according to another embodiment of the inventive concept.

Referring to FIG. 14, the memory module 1400 includes the memory devices 110 and a memory buffer 1420. The memory devices 110 and the memory buffer 1420 may be connected to each other via a bus 1421. The bus 1421 may include a command line, an address line, a data I/O line, and the like. The memory devices 110 of FIG. 14 are the same as the memory devices 110 described with reference to FIG. 3. The memory buffer 1420 is substantially the same as the memory controller 920 described with reference to FIG. 9. To avoid redundancy in description, detailed descriptions of elements in the memory buffer 1420 are omitted.

The memory buffer 1420 may store antifuse codes in an antifuse mapping register 1022, wherein the antifuse codes are read by an antifuse circuit unit 112 in the memory device 110. A first delay setting unit 1006 may control a command output time, in response to the antifuse codes stored in the antifuse mapping register 1022. A second delay setting unit 1016 may control an address output time, in response to the antifuse codes stored in the antifuse mapping register 1022. Accordingly, the first and second delay setting units 1006 and 1016 may satisfy a timing parameter spec. or a refresh spec. of the memory device 110.

Figure 15:
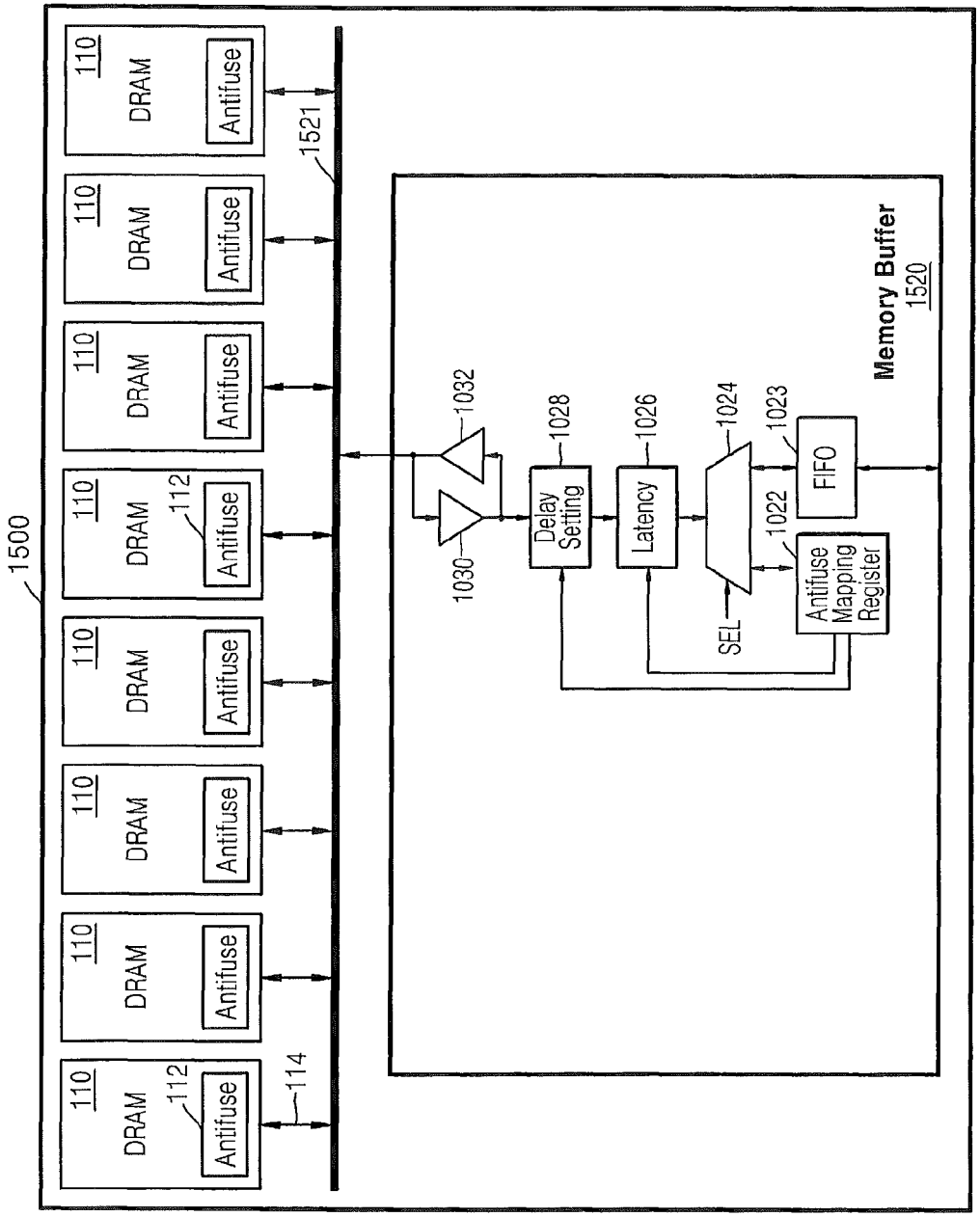
FIG. 15 is a diagram of a memory module including a plurality of memory devices, according to another embodiment of the inventive concept.

FIG. 15 is a diagram of a memory module 1500 including a plurality of memory devices 110, according to another embodiment of the inventive concept.

Referring to FIG. 15, the memory module 1500 includes the memory devices 110 and a memory buffer 1520. The memory devices 110 and the memory buffer 1520 may be connected to each other via a bus 1521. The bus 1521 may include a command line, an address line, a data I/O line, and the like. The memory devices 110 of FIG. 15 are the same as the memory devices 110 described with reference to FIG. 3. The memory buffer 1520 is substantially the same as the memory controller 1120 described with reference to FIG. 11. To avoid redundancy in description, detailed descriptions of elements in the memory buffer 1520 are omitted.

The memory buffer 1520 may store antifuse codes in an antifuse mapping register 1022, wherein the antifuse codes are read by an antifuse circuit unit 112 in the memory device 110. A third delay setting unit 1028 may control a transmission time of data exchanged via a data I/O bus 1021, in response to the antifuse codes stored in the antifuse mapping register 1022. A latency control unit 1026 may control a read latency, a write latency, or a CAS latency of the data exchanged via the data I/O bus 1021, in response to the antifuse codes stored in the antifuse mapping register 1022. Accordingly, the third delay setting unit 1028 and the latency control unit 1026 may satisfy a timing parameter spec. and an I/O trigger voltage spec. of the memory device 110.

Figure 16:
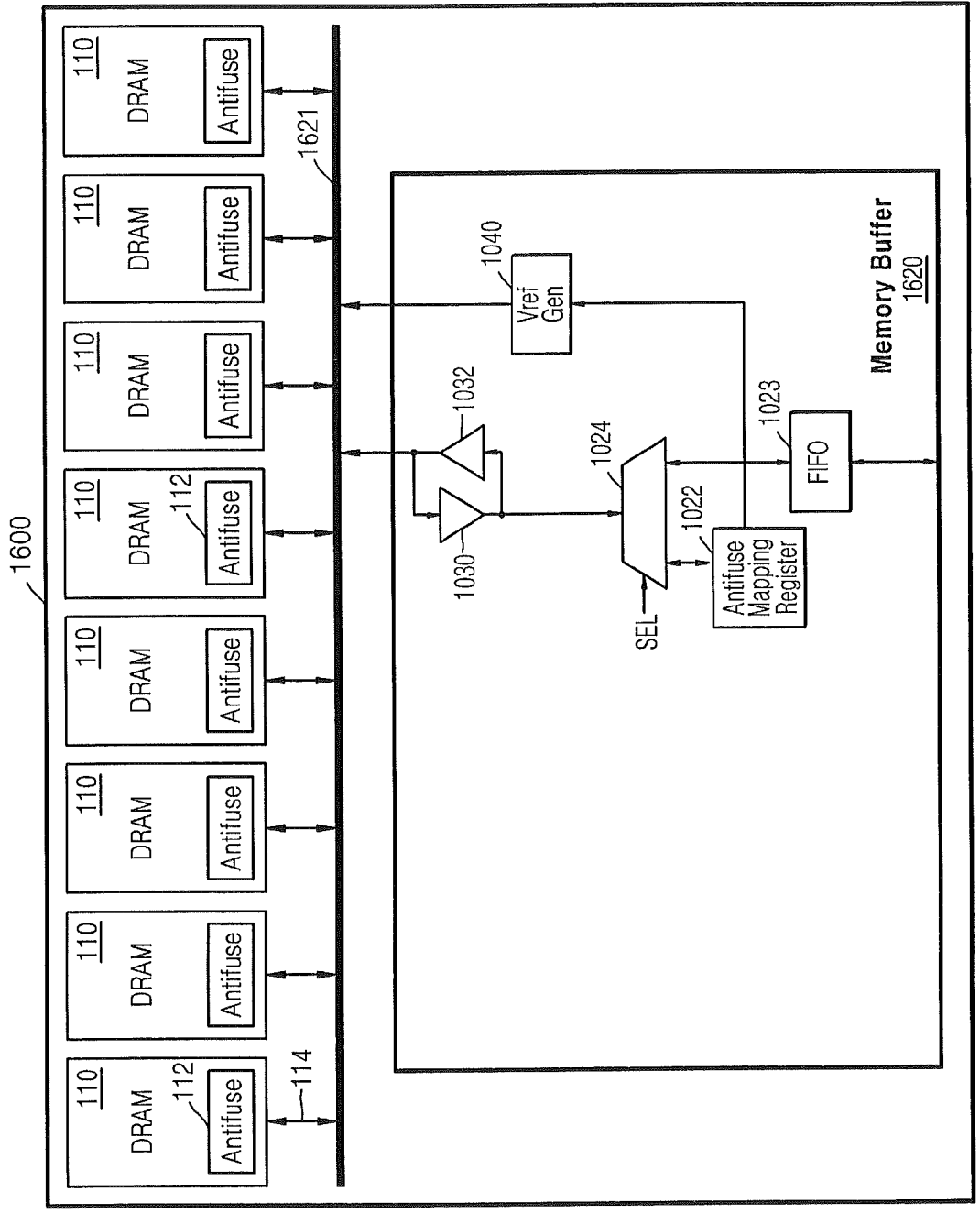
FIG. 16 is a diagram of a memory module including a plurality of memory devices, according to another embodiment of the inventive concept.

FIG. 16 is a diagram of a memory module 1600 including a plurality of memory devices 110, according to another embodiment of the inventive concept.

Referring to FIG. 16, the memory module 1600 includes the memory devices 110 and a memory buffer 1620. The memory devices 110 and the memory buffer 1620 may be connected to each other via a bus 1621. The bus 1621 may include a command line, an address line, a data I/O line, and the like. The memory devices 110 of FIG. 16 are the same as the memory devices 110 described with reference to FIG. 3. The memory buffer 1620 is substantially the same as the memory controller 1220 described with reference to FIG. 12. To avoid redundancy in description, detailed descriptions of elements in the memory buffer 1620 are omitted.

The memory buffer 1620 may store antifuse codes in an antifuse mapping register 1022, wherein the antifuse codes are read by an antifuse circuit unit 112 in the memory device 110. A reference voltage generating circuit 1040 may adjust levels of a reference voltage VREF, in response to antifuse codes of the reference voltage VREF, which are stored in the antifuse mapping register 1022. Accordingly, the reference voltage generating circuit 1040 may satisfy an I/O trigger voltage spec. of the memory device 110.

Figure 17:
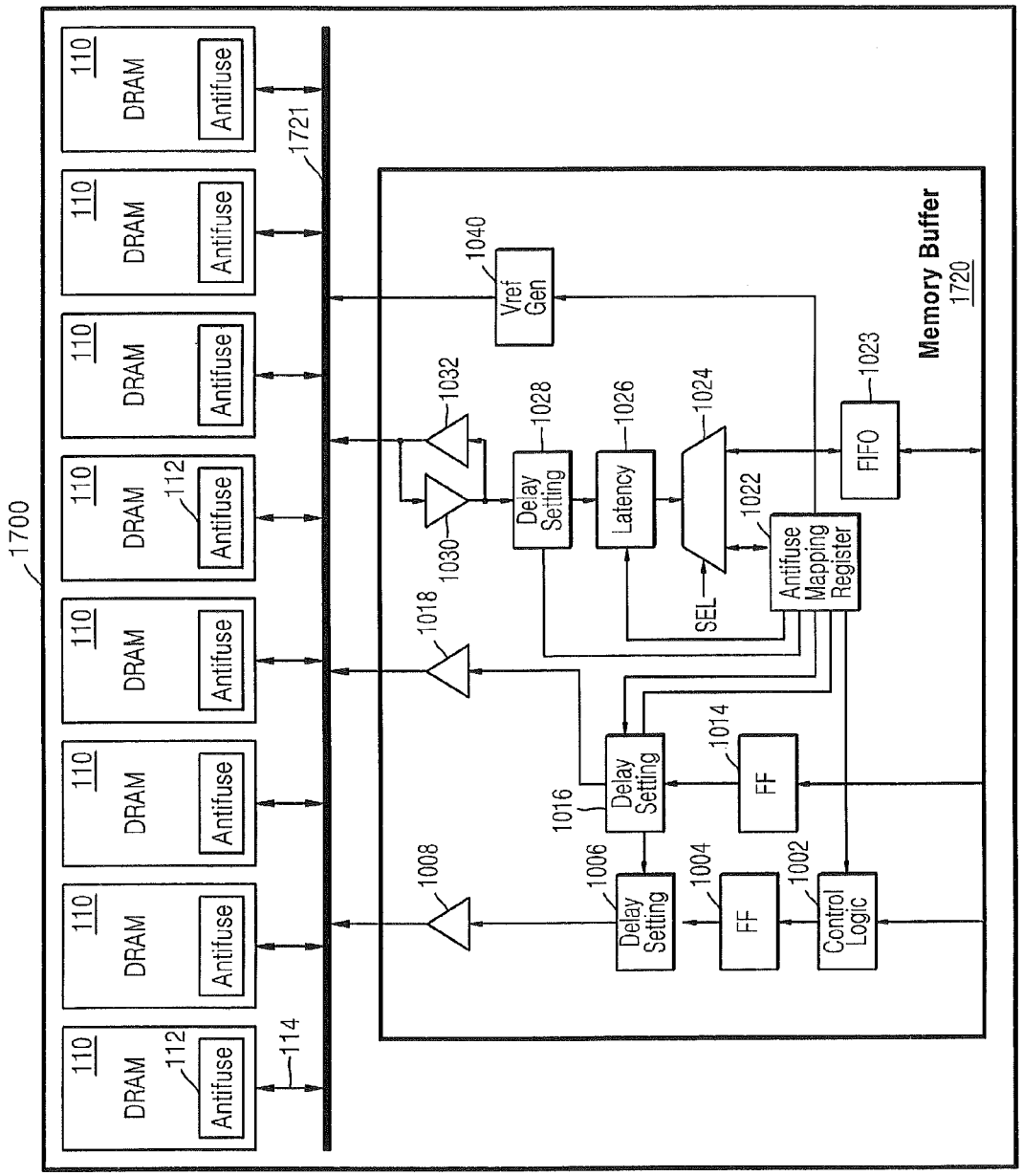
FIG. 17 is a diagram of a memory module including a plurality of memory devices, according to another embodiment of the inventive concept.

FIG. 17 is a diagram of a memory module 1700 including a plurality of memory devices 110, according to another embodiment of the inventive concept.

Referring to FIG. 17, the memory module 1700 includes the memory devices 110 and a memory buffer 1720. The memory devices 110 and the memory buffer 1720 may be connected to each other via a bus 1721. The bus 1621 may include a command line, an address line, a data I/O line, and the like. The memory devices 110 of FIG. 17 are the same as the memory devices 110 described with reference to FIG. 3. The memory buffer 1720 is substantially the same as the memory controller 1320 described with reference to FIG. 13. To avoid redundancy in description, detailed descriptions of elements in the memory buffer 1720 are omitted.

The memory buffer 1720 may store antifuse codes in an antifuse mapping register 1022, wherein the antifuse codes are read by an antifuse circuit unit 112 in the memory device 110. A first delay setting unit 1006 may control a command output time, in response to antifuse codes stored in the antifuse mapping register 1022. A second delay setting unit 1016 may control an address output time, in response to the antifuse codes stored in the antifuse mapping register 1022. A third delay setting unit 1028 may control a transmission time of data exchanged via a data I/O bus 1021, in response to the antifuse codes stored in the antifuse mapping register 1022. A latency control unit 1026 may control a read latency, a write latency, or a CAS latency of the data exchanged via the data I/O bus 1021, in response to the antifuse codes stored in the antifuse mapping register 1022. A reference voltage generating circuit 1040 may adjust levels of a reference voltage VREF, in response to antifuse codes of the reference voltage VREF, which are stored in the antifuse mapping register 1022. Accordingly, the first through third delay setting units 1006, 1016, and 1028, the latency control unit 1026, and the reference voltage generating circuit 1040 may satisfy a timing parameter spec., a refresh spec., and an I/O trigger voltage spec. of the memory device 110.

According to a user request for a lightweight, a small-size, a high-speed, a multi-function, and a high-function, a chip scale package or a chip size package, which is one of the electronic product assembling technologies, is being developed. The chip scale package may significantly reduce a thickness or a size of a memory package. When memory devices of the chip scale package are stacked, electrodes and micro-bumps may be disposed therebetween to facilitate a physical contact between each of the memory devices.

Also, a wafer-level chip scale package is being developed. In general, when a semiconductor wafer is manufactured via a wafer manufacturing process, chips are separated from the semiconductor wafer and then are assembled via a package assembling process. The package assembling process requires different equipments and raw materials and thus is totally different from the wafer manufacturing process. However, the wafer-level chip scale package may be manufactured as a complete product while chips are not separated from a wafer. That is, wafer manufacturing equipments or processes may also be used to manufacture the wafer-level chip scale package. This means that costs that are additionally incurred to manufacture the wafer-level chip scale package may be reduced or minimized.

In this regard, a stack package in which the wafer-level chip scale packages are three-dimensionally stacked is introduced. To three-dimensionally stack the wafer-level chip scale packages, an electrical contact is required between the wafer-level chip scale packages that are vertically stacked. For the electrical contact, a hole that passes through a memory chip is formed, and then a through hole is formed in the hole.

To form the through hole, the hole that passes through a chip pad of a semiconductor chip and that has a predetermined depth is formed. Afterward, an under bump metal (UBM) is formed in an inner side of the hole that passes through the chip pad, and a metal material fills the hole. Afterward, a rear side of a wafer is polished, so that a front surface of a metal layer filled in the hole is exposed. That is, the front surface of the through hole, which is exposed via the polished rear side of the wafer may be used as an external connection terminal when the package is stacked.

To electrically connect the chip scale packages that are stacked, a metal bump may be formed in a side surface of a hole. To form the metal bump, a plating method is used, in which an UBM is formed on a surface to be the metal bump and then a photography process using a photosensitive film is performed.

Also, to electrically connect the chip scale packages that are stacked, a micro-bump may be formed in a projection portion that is formed by externally exposing a portion of a metal layer formed in a hole.

Figure 18:
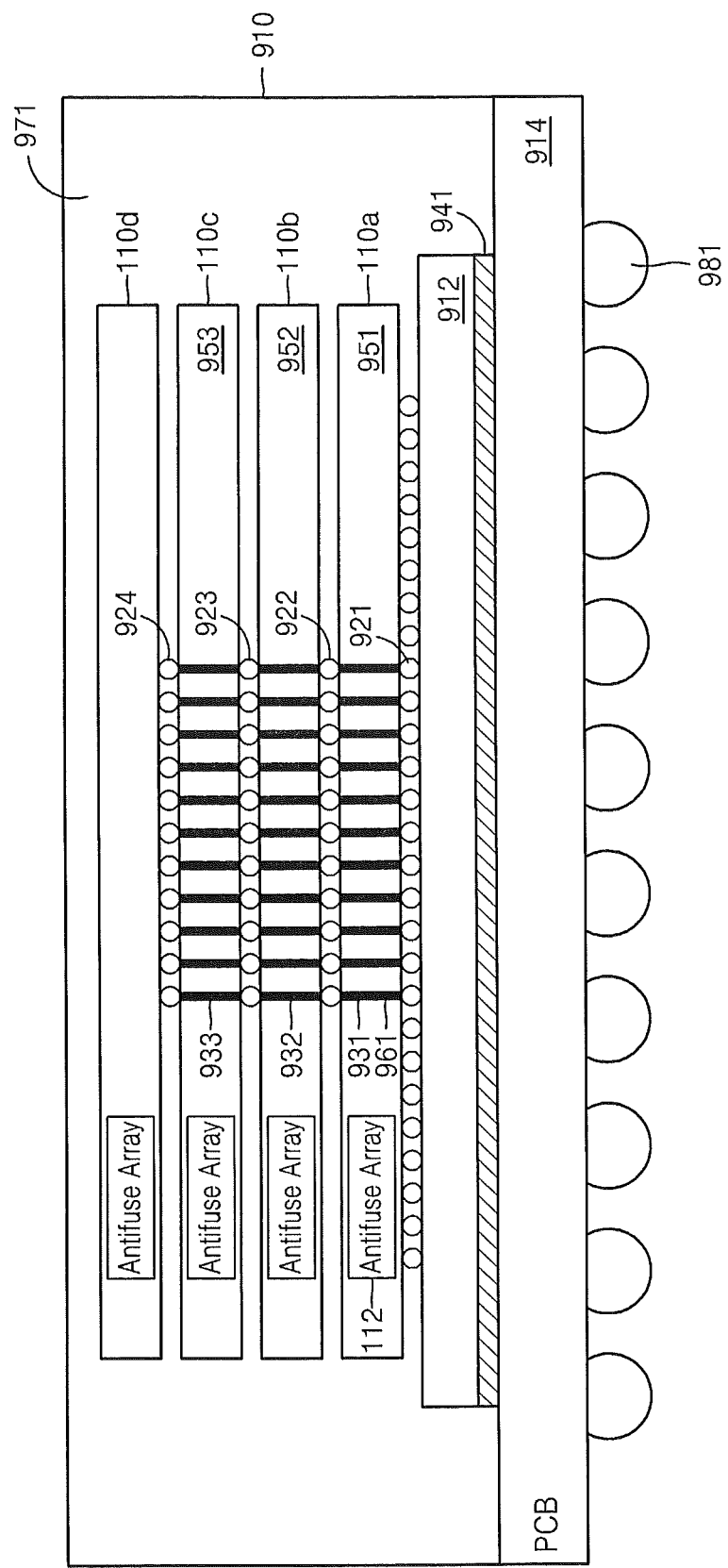
FIG. 18 is a cross-sectional view illustrating a memory package in which memory devices are stacked, according to an embodiment of the inventive concept.

FIG. 18 is a cross-sectional view illustrating a memory package 910 in which memory devices are stacked, according to an embodiment of the inventive concept.

Referring to FIG. 18, the memory package 910 may have a structure in which first through fourth memory layers 110a through 110d are stacked on a bottom chip 912. Each of the first through fourth memory layers 110a through 110d may have the same elements as the memory device 110 described above with reference to FIG. 3, and may be a memory chip or a memory die. However, various numbers of memory layers other than the first through fourth memory layers 110a through 110d may be stacked in the memory package 910.

The bottom chip 912 and the first memory layer 110a may be electrically connected to each other by micro-bumps 921. The first memory layer 110a and the second memory layer 110b may be electrically connected to each other by micro-bumps 922. The second memory layer 110 band the third memory layer 110c may be electrically connected to each other by micro-bumps 923. The third memory layer 110c and the fourth memory layer 110d may be electrically connected to each other by micro-bumps 924. The stacked bottom chip 912 and first through fourth memory layers 110a through 110d are layered on a printed circuit board (PCB) 914 by using an adhesive 941.

In the first memory layer 110a, a substrate 951 may include one or more through electrodes 931 that perform internal I/O. In the present description, the internal I/O means data I/O between stacked chips. The one or more through electrodes 931 may be formed in a manner that one or more vias 961 are formed in the substrate 951 and then are filled with a conductive material. The one or more vias 961 may be formed by using a laser or by dry-etching.

Each through electrode 931 functions to electrically connect the first memory layer 110a and the bottom chip 912, and to implement a wide I/O bus, each through electrode 931 may have a fine pitch equal to or less than 100 um. Thus, each through electrode 931 may be formed to be used in a high circuit density region.

To form the one or more through electrodes 931, it is required for the one or more vias 961 to have a reduced or minimized diameter. Thus, the one or more through electrodes 931 may be formed via a via first technique in which vias are initially formed in a front end process. Due to the one or more through electrodes 931 having a fine pitch, a data transmission speed may be increased.

The second and third memory layers 110b and 110c may perform internal I/O via through electrodes 932 and 933 formed in substrates 952 and 953, respectively. In the memory package 910, the bottom chip 912 and the micro-bumps 921 through 924 of the first through fourth memory layers 110a through 110d may be electrically connected to each other via the through electrodes 931 through 933. A plastic molding compound 971 fixes the stacked bottom chip 912 and first through fourth memory layers 110a through 110d, and protects them against an external environment. The stacked bottom chip 912 and first through fourth memory layers 110a through 110d are electrically connected to an external system via solder balls 981 of the PCB 914.

Similar to the memory devices 110 mounted in the memory modules 100 and 710 of FIGS. 1 and 7, a timing parameter spec., a refresh spec., an I/O trigger voltage spec., and a data training spec. of each of the first through fourth memory layers 110a through 110d that are stacked in the memory package 910 may deviate due to a change in a power voltage VDD or in a temperature.

Each of the first through fourth memory layers 110a through 110d may store information related to the timing parameter spec., the refresh spec., the I/O trigger voltage spec., and the data training spec. in the antifuse circuit unit 112 mounted in each of the first through fourth memory layers 110a through 110d. For example, the antifuse circuit unit 112 of the first memory layer 110a may store tRCD, tRP, tRAS, and tAA parameters related to the timing parameter spec. The antifuse circuit unit 112 of the first memory layer 110a may store tRFC and tREFI parameters related to the refresh spec. Also, the antifuse circuit unit 112 of the first memory layer 110a may store calibration information related to the data training spec.

In response to the information stored in the antifuse circuit unit 112 of each of the first through fourth memory layers 110a through 110d, the bottom chip 912 may perform a correction operation so as to satisfy the timing parameter spec., the refresh spec., the I/O trigger voltage spec., and the data training spec. of each of the first through fourth memory layers 110a through 110d. The bottom chip 912 may be configured the same as the memory controller 1320 described with reference to FIG. 13.

Figure 19:
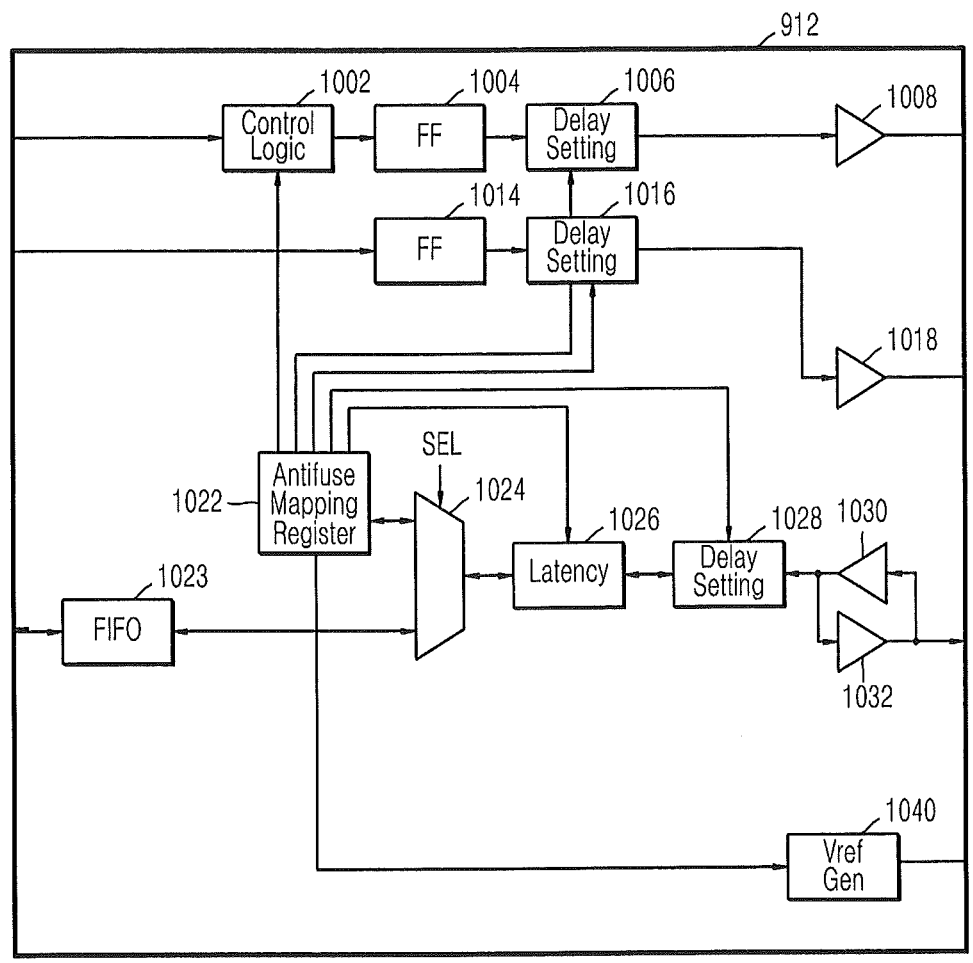
FIG. 19 is a diagram illustrating a bottom chip of FIG. 18.

FIG. 19 is a diagram illustrating the bottom chip 912 of FIG. 18 according to an embodiment of the inventive concept.

Referring to FIG. 19, the bottom chip 912 may store antifuse codes in an antifuse mapping register 1022, wherein the antifuse codes are read by the antifuse circuit unit 112 of each of the first through fourth memory layers 110a through 110d. A first delay setting unit 1006 may control a command output time, in response to the antifuse codes stored in the antifuse mapping register 1022. A second delay setting unit 1016 may control an address output time, in response to the antifuse codes stored in the antifuse mapping register 1022. A third delay setting unit 1028 may control a data transmission time, in response to the antifuse codes stored in the antifuse mapping register 1022. A latency control unit 1026 may control a read latency, a write latency, or a CAS latency of data, in response to the antifuse codes stored in the antifuse mapping register 1022. A reference voltage generating circuit 1040 may adjust levels of a reference voltage VREF, in response to antifuse codes of the reference voltage VREF, which are stored in the antifuse mapping register 1022. Accordingly, the first, second, and third delay setting units 1006, 1016, and 1028, the latency control unit 1026, and the reference voltage generating circuit 1040 may satisfy the timing parameter spec., the refresh spec., and the I/O trigger voltage spec. of each of the first through fourth memory layers 110a through 110d.

While the inventive concept has been particularly shown and described with reference to exemplary embodiments thereof, it will be understood that various changes in form and details may be made therein without departing from the spirit and scope of the following claims.

What is claimed is:

1. A memory device comprising:
a memory cell array comprising a plurality of memory cells; and
an antifuse circuit unit comprising at least one antifuse that stores a defective cell address of the memory cell array in the at least one antifuse and outputs the defective cell address to an external source;
wherein the antifuse circuit unit stores the defective cell address that occurs after the memory device is packaged; and
wherein the memory device commands a start of a read mode or a program mode of the antifuse circuit unit, by using a refresh command for refreshing a plurality of pieces of data of the plurality of memory cells in the memory cell array.

2. The memory device of claim 1, wherein the antifuse circuit unit stores the defective cell address that occurs when the memory device is tested.

3. The memory device of claim 1, wherein the antifuse circuit unit stores and updates the defective cell address.

4. The memory device of claim 1, wherein the antifuse circuit unit outputs the defective cell address, in response to a power-up detection signal indicating that a power of the memory device is stabilized.

5. The memory device of claim 1, further comprising a selecting unit that receives data of each of the plurality of memory cells which is read from the memory cell array, and the defective cell address that is read from the antifuse circuit unit, selects the data of each of the plurality of memory cells or the defective cell address, and then outputs the data or the defective cell address by using at least one data input/output (I/O) signal.

6. The memory device of claim 1, wherein the memory device comprises a through hole and a micro-bump connected to the through hole.

7. A memory module comprising:
at least one memory device; and
a memory buffer comprising a storage unit that is accessed instead of a defective cell, when an access to the defective cell in the at least one memory device is requested,
wherein the at least one memory device comprises an antifuse circuit unit comprising at least one antifuse that stores an address of the defective cell of a memory cell array in the at least one antifuse, and outputs the address of the defective cell to the memory buffer;
wherein the antifuse circuit unit stores the address of the defective cell that occurs after the at least one memory device is packaged; and
wherein the memory buffer comprises:
a logic circuit unit that stores the address of the defective cell, and generates a hit signal by comparing the address of the defective cell with an address that is input from an external source, the logic circuit unit comprising:
a fail address table that receives and stores the address of the defective cell read from the antifuse circuit unit of the at least one memory device; and
an address comparing unit that generates the hit signal by comparing an address transmitted from a host with the address of the defective cell stored in the fail address table.

8. The memory module of claim 7, wherein:
the storage unit stores data to be written to the address of the defective cell; and the memory buffer further comprises:
a selecting unit that writes the data to the storage unit or reads data from the storage unit in response to the hit signal.

9. The memory module of claim 7, wherein the storage unit comprises only one register so as to rescue only the defective cell in the memory module.

10. The memory module of claim 7, wherein the storage unit comprises a plurality of registers so as to rescue a plurality of the defective cells in the memory module.

11. A memory system comprising:
at least one memory device; and
a memory controller comprising a storage unit that is accessed instead of a defective cell when an access to the defective cell in the at least one memory device is requested,
wherein the at least one memory device comprises an antifuse circuit unit comprising at least one antifuse that stores an address of the defective cell of a memory cell array in the at least one antifuse, and outputs the address of the defective cell to the memory controller;
wherein the antifuse circuit unit stores the address of the defective cell that occurs after the memory device is packaged; and
wherein the memory controller comprises:
a logic circuit unit stores the address of the defective cell and generates a hit signal by comparing the address of the defective cell with an address that is input from an external source, the logic circuit comprising:
a fail address table that receives and stores the address of the defective cell read from the antifuse circuit unit of the memory module; and
an address comparing unit that generates the hit signal by comparing an address transmitted from a host with the address of the defective cell stored in the fail address table.

12. The memory system of claim 11, wherein
the storage unit stores data to be written to the address of the defective cell; and the memory controller further comprises:
a selecting unit writes the data to the storage unit or reads data from the storage unit in response to the hit signal.

13. The memory system of claim 11, wherein the storage unit comprises only one register so as to rescue only the defective cell in the memory module.

14. The memory system of claim 11, wherein the storage unit comprises a plurality of registers so as to rescue a plurality of the defective cells in the memory module.

15. A memory controller comprising:
a logic circuit unit that stores an address of a defective cell in a memory device, and generates a hit signal;
a storage unit that stores data to be written to the address of the defective cell; and
a selecting unit that writes the data to the storage unit or reads data from the storage unit in response to the hit signal;
wherein the logic circuit unit comprises:
a fail address table that receives and stores the address of the defective cell read from the memory device; and
an address comparing unit that generates the hit signal by comparing an address input from an external source with the address of the defective cell stored in the fail address table; and
wherein the logic circuit unit stores the address of the defective cell that occurs after the memory device is packaged.

16. A memory device comprising:
a memory cell array comprising a plurality of memory cells; and
an antifuse circuit unit comprising at least one antifuse that stores a defective cell address of the memory cell array in the at least one antifuse and outputs the defective cell address to an external source;
wherein the antifuse circuit unit stores the defective cell address that occurs after the memory device is packaged; and
wherein the memory device commands an end of a read mode or a program mode of the antifuse circuit unit, by using a refresh command for ending a refresh operation of the plurality of memory cells in the memory cell array.

17. The memory device of claim 16, wherein the antifuse circuit unit stores the defective cell address that occurs when the memory device is tested.

18. The memory device of claim 16, wherein the antifuse circuit unit stores and updates the defective cell address.

19. The memory device of claim 16, wherein the antifuse circuit unit outputs the defective cell address, in response to a power-up detection signal indicating that a power of the memory device is stabilized.

* * * * *